United States Patent
Wohlberg

(10) Patent No.: US 9,684,951 B2
(45) Date of Patent: Jun. 20, 2017

(54) EFFICIENT CONVOLUTIONAL SPARSE CODING

(71) Applicant: Los Alamos National Security, LLC, Los Alamos, NM (US)

(72) Inventor: Brendt Wohlberg, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 149 days.

(21) Appl. No.: 14/668,900

(22) Filed: Mar. 25, 2015

(65) Prior Publication Data

US 2016/0335224 A1    Nov. 17, 2016

Related U.S. Application Data

(60) Provisional application No. 61/972,779, filed on Mar. 31, 2014.

(51) Int. Cl.
*G06K 9/64*    (2006.01)
*G06T 5/00*    (2006.01)
(Continued)

(52) U.S. Cl.
CPC .............. *G06T 5/004* (2013.01); *G06F 17/14* (2013.01); *H03M 7/00* (2013.01); *G06T 2207/20056* (2013.01)

(58) Field of Classification Search
CPC ........ G06K 9/62; G06K 9/527; G06K 9/6247; H04N 19/97; G06T 5/001; G06T 5/004; G06T 5/20; G06F 17/15; G06F 17/156
See application file for complete search history.

(56) References Cited

U.S. PATENT DOCUMENTS

| 7,196,641 | B2* | 3/2007 | Huang | G10L 19/008 |
| | | | | 341/50 |
| 7,271,747 | B2* | 9/2007 | Baraniuk | G06K 9/0057 |
| | | | | 341/50 |

(Continued)

OTHER PUBLICATIONS

A. D. Szlam et al., "Convolutional Matching Pursuit and Dictionary Training," CoRR, (Oct. 3, 2010).

(Continued)

*Primary Examiner* — Amir Alavi
(74) *Attorney, Agent, or Firm* — LeonardPatel PC

(57) ABSTRACT

Computationally efficient algorithms may be applied for fast dictionary learning solving the convolutional sparse coding problem in the Fourier domain. More specifically, efficient convolutional sparse coding may be derived within an alternating direction method of multipliers (ADMM) framework that utilizes fast Fourier transforms (FFT) to solve the main linear system in the frequency domain. Such algorithms may enable a significant reduction in computational cost over conventional approaches by implementing a linear solver for the most critical and computationally expensive component of the conventional iterative algorithm. The theoretical computational cost of the algorithm may be reduced from $O(M^3N)$ to $O(MN \log N)$, where N is the dimensionality of the data and M is the number of elements in the dictionary. This significant improvement in efficiency may greatly increase the range of problems that can practically be addressed via convolutional sparse representations.

11 Claims, 19 Drawing Sheets

(51) Int. Cl.
G06F 17/14 (2006.01)
H03M 7/00 (2006.01)

(56) References Cited

U.S. PATENT DOCUMENTS

| | | | | |
|---|---|---|---|---|
| 7,970,209 B2* | 6/2011 | Yoon | ................... | H03M 5/145 |
| | | | | 365/125 |
| 8,538,200 B2* | 9/2013 | Wang | ................... | G06T 3/4053 |
| | | | | 345/582 |
| 8,693,765 B2* | 4/2014 | Mercier | ................ | G06K 9/527 |
| | | | | 382/155 |
| 9,313,072 B2* | 4/2016 | Katabi | .................. | H04L 27/265 |

OTHER PUBLICATIONS

A. M. Bruckstein et al., "From Sparse Solutions of Systems of Equations to Sparse Modeling of Signals and Images," SIAM Review, vol. 51, No. 1, pp. 34-81 (2009).
B. A. Olshausen et al., "Learning Sparse Image Codes Using a Wavelet Pyramid Architecture," Adv. Neural Inf. Process. Syst., vol. 13, pp. 887-893 (2000).
B. Mailhe et al., "Dictionary Learning with Large Step Gradient Descent for Sparse Representations," Latent Variable Analysis and Signal Separation, ser. Lecture Notes in Computer Science, F. J. Theis et al., Eds. Springer Berlin Heidelberg, vol. 7191, pp. 231-238 (2012).
B. Ophir et al., "Multi-Scale Dictionary Learning Using Wavelets," IEEE J. Sel. Topics Signal Process., vol. 5, No. 5, pp. 1014-1024 (Sep. 2011).
B.S. He et al., "Alternating Direction Method with Self-Adaptive Penalty Parameters for Monotone Variational Inequalities," Journal of Optimization Theory and Applications, vol. 106, No. 2, pp. 337-356 (Aug. 2000).
C. Rusu et al., "Explicit Shift-Invariant Dictionary Learning," IEEE Signal Process. Lett., vol. 21, No. 1, pp. 6-9 (Jan. 2014).
H. Bristow et al., "Fast Convolutional Sparse Coding," Proceedings of the IEEE Conference on Computer Vision and Pattern Recognition (CVPR), pp. 391-398 (Jun. 2013).
J. Eckstein, "Augmented Lagrangian and Alternating Direction Methods for Convex Optimization: A Tutorial and some Illustrative Computational Results," Rutgers Center for Operations Research, Rutgers University, Rutcor Research Report RRR 32-2012, http://rutcor.rutgers.edu/pub/rrr/reports2012/32 2012.pdf (Dec. 2012).
J. Mairal et al., "Non-Local Sparse Models for Image Restoration," Proceedings of the IEEE International Conference on Computer Vision (CVPR), pp. 2272-2279 (2009).
J. Mairal et al., "Task-Driven Dictionary Learning," IEEE Transactions on Pattern Analysis and Machine Intelligence, vol. 34, No. 4, pp. 791-804 (Apr. 2012).
J. Yang et al., "Supervised Translation-Invariant Sparse Coding," Proceedings of the IEEE Conference on Computer Vision and Pattern Recognition (CVPR), pp. 3517-3524 (2010).
K. Engan et al., "Method of Optimal Directions for Frame Design," Proceedings of the IEEE International Conference on Acoustics, Speech, and Signal Processing (ICASSP), vol. 5, pp. 2443-2446 (1999).
K. Kavukcuoglu et al., "Learning Convolutional Feature Hierachies for Visual Recognition," Advances in Neural Information Processing Systems (NIPS) (2010).
K. Skretting et al., "General Design Algorithm for Sparse Frame Expansions," Signal Process., vol. 86, No. 1, pp. 117-126, (Jan. 2006).
K. Skretting et al., "Image Compression Using Learned Dictionaries by RLS-DLA and Compared with K-SVD," Proc. IEEE Int. Conf. Acoust. Speech Signal Process. (ICASSP), pp. 1517-1520 (May 2011).
M. D. Zeiler et al., "Adaptive Deconvolutional Networks for Mid and High Level Feature Learning," Proc. IEEE Int. Conf. Comp. Vis. (ICCV), pp. 2018-2025 (2011).
M. D. Zeiler et al., "Deconvolutional Networks," Proceedings of the IEEE Conference on Computer Vision and Pattern Recognition (CVPR), pp. 2528-2535 (Jun. 2010).
M. Pachitariu et al., "Extracting Regions of Interest from Biological Images with Convolutional Sparse Block Coding," Adv. Neural Inf. Process. Syst., vol. 26, pp. 1745-1753 (2013).
M. S. Lewicki et al., "Coding Time-Varying Signals Using Sparse, Shift-Invariant Representations," Adv. Neural Inf. Process. Syst., vol. 11, pp. 730-736 (1999).
M. V. Afonso et al., "Fast Image Recovery Using Variable Splitting and Constrained Optimization," IEEE Trans. Image Process., vol. 19, No. 9, pp. 2345-2356 (2010).
Manya V. Afonso et al., "An Augmented Lagrangian Approach to the Constrained Optimization Formulation of Imaging Inverse Problems," IEEE Transactions on Image Processing, vol. 20, No. 3 (Mar. 2011).
N. Egidi et al., "A Sherman-Morrison Approach to the Solution of Linear Systems," Journal of Computational and Applied Mathematics, vol. 189, No. 1-2, pp. 703-718 (May 2006).
R. Chalasani et al., "A Fast Proximal Method for Convolutional Sparse Coding," Proceedings of the International Joint Conference on Neural Networks (IJCNN), pp. 1-5 (Aug. 2013).
R. Grosse et al., "Shift-Invariant Sparse Coding for Audio Classification," Proc. Twenty-Third Conf. on Uncertainty in Artificial Intell. (UAI), pp. 149-158 (Jul. 2007).
S. Boyd et al., "Distributed Optimization and Statistical Learning via the Alternating Direction Method of Multipliers," Foundations and Trends in Machine Learning, vol. 3, No. 1, pp. 1-122 (2010).
S. S. Chen et al., "Atomic Decomposition by Basis Pursuit," SIAM Journal on Scientific Computing, vol. 20, No. 1, pp. 33-61 (1998).
T. Blumensath et al., "On Shift-Invariant Sparse Coding," Independent Component Analysis and Blind Signal Separation, ser. Lecture Notes in Computer Science, vol. 3195, pp. 1205-1212 (2004).
T. Blumensath et al., "Shift-Invariant Sparse Coding for Single Channel Blind Source Separation," Signal Processing with Adaptative Sparse Structured Representations (SPARS) (Nov. 2005).
T. Blumensath et al., "Sparse and Shift-Invariant Representations of Music," IEEE Trans. Audio, Speech, Language Process., vol. 14, No. 1, pp. 50-57 (Jan. 2006).
T. Blumensath et al., "Unsupervised Learning of Sparse and Shift-Invariant Decompositions of Polyphonic Music," Proc. IEEE Int. Conf. Acoust. Speech Signal Process. (ICASSP), vol. 5, pp. 497-500 (May 2004).
W. W. Hager, "Updating the Inverse of a Matrix," SIAM Review, vol. 31, No. 2, pp. 221-239 (Jun. 1989).
Y Boureau et al., "Learning Mid-Level Features for Recognition," Proceedings of the IEEE Conference on Computer Vision and Pattern Recognition (CVPR), pp. 2559-2566 (Jun. 2010).

* cited by examiner

RELATED ART

RELATED ART

RELATED ART

1100

EFFICIENT CONVOLUTIONAL SPARSE CODING

CROSS REFERENCE TO RELATED APPLICATION

This application claims the benefit of U.S. provisional patent application No. 61/972,779 filed on Mar. 31, 2014. The subject matter of this earlier filed application is hereby incorporated by reference in its entirety.

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD

The present invention generally relates to sparse coding, and more particularly, to efficient convolutional sparse coding derived within an alternating direction method of multipliers (ADMM) framework that utilizes fast Fourier transforms (FFT) for convolutional sparse representations.

BACKGROUND

Sparse representation is a widely used technique for a broad range of signal and image processing applications. For instance, sparse representations may be used for labeling objects in images to identify and classify what objects are present. Given a signal s and a dictionary matrix D, sparse coding is the inverse problem of finding the sparse representation x with only a few non-zero entries such that $Dx \approx s$. The process of arriving at these identifications is non-trivial and complex.

Different approaches to sparse coding have been proposed. However, most sparse coding algorithms optimize a functional consisting of a data fidelity term and a sparsity inducing penalty of the form $$\underset{x}{\mathrm{argmin}}\, \frac{1}{2}\|Dx-s\|_2^2 + \lambda R(x) \qquad (1)$$

or constrained forms such as $$\underset{x}{\mathrm{argmin}}\, R(x) \text{ such that } \|Dx-s\|_2 \leq \epsilon \qquad (2)$$

or $$\underset{x}{\mathrm{argmin}}\, \|Dx-s\|_2 \text{ such that } R(x) \leq \tau \qquad (3)$$

where D is a dictionary matrix, x is the sparse representation, $\lambda$ is a regularization parameter, $\epsilon$ is a reconstruction error threshold, $\tau$ is a sparsity threshold, and $R(\cdot)$ denotes a sparsity inducing function such as the $l^1$ norm or the $l^0$ "norm." While the $l^0$ norm does not conform to all of the requirements of a real norm, it is convenient to write it using norm notation. Regularization parameter $\lambda$ controls the relative importance of the data fidelity term that penalizes a solution that does not match the data and the regularization term that penalizes a solution that is not sparse (i.e., one that has too many non-zero entries). When applied to images, this decomposition is usually applied independently to a set of overlapping image patches covering the image. This approach is convenient, but often necessitates somewhat ad hoc subsequent handling of the overlap between patches. This results in a representation over the whole image that is suboptimal.

The two leading families of sparse coding methods are: (1) a wide variety of convex optimization algorithms (e.g., Alternating Direction Method of Multipliers (ADMM)) for solving Eq. (1) when $R(x) = \|x\|_1$; and (2) a family of greedy algorithms (e.g., matching Pursuit (MP) and Orthogonal Matching Pursuit (OMP)) for providing an approximate solution for Eq. (2) or Eq. (3) when $R(x) = \|x\|_0$.

If the dictionary D is analytically defined and corresponds to a linear operator with a fast transform (e.g., the Discrete Wavelet Transform), a representation for an entire signal or image can readily be computed. More recently, however, it has been realized that improved performance can be obtained by learning the dictionary from a set of training data relevant to a specific problem. This inverse problem is known as "dictionary learning." In this case, computing a sparse representation for an entire signal is not feasible, with the usual approach being to apply the decomposition independently to a set of overlapping blocks covering the signal, as illustrated in independent sparse representation 100 of FIG. 1. This approach is relatively straightforward to implement, but results in a representation that is multi-valued and suboptimal over the signal as a whole, often necessitating somewhat ad hoc handling of the overlap between blocks.

An optimal representation for a given block structure would involve solving a single optimization problem for a block matrix dictionary $\tilde{D}$ with blocks consisting of appropriately shifted versions of the single-block dictionary D, as illustrated in jointly optimized sparse representation 200 of FIG. 2. If the block structure is modified such that the step between blocks is a single sample, as in equivalence 300 of FIG. 3, the representation on the resulting block dictionary $\tilde{D}$ is both optimal for the entire signal and shift-invariant. Furthermore, in this case, the linear representation on the block dictionary $\tilde{D}$ can be expressed as a sum of convolutions of columns $d_m$ of D with a set of spatial coefficient maps corresponding to the subsets of x associated with different shifts of each column of D. In other words, by a straightforward change of indexing of coefficients, the representation $\tilde{D}x \approx s$ is equivalent to $\Sigma_m d_m * x_m \approx s$. This form of sparse representation is referred to here as a "convolutional" sparse representation.

Convolutional BPDN

While convolutional forms can be constructed for each of Eq. (1)-(3), the focus herein is on the convolutional form of Eq. (1) with $R(x) = \|x\|_1$, i.e. the BPDN problem $$\underset{x}{\mathrm{argmin}}\, \frac{1}{2}\|Dx-s\|_2^2 + \lambda \|x\|_1 \qquad (4)$$

Recently, these techniques have been applied to computer vision problems such as face recognition and image classification. In this context, convolutional sparse representations were introduced, replacing Eq. (4) with $$\underset{\{x_m\}}{\mathrm{argmin}}\, \frac{1}{2}\left\|\sum_m d_m * x_m - s\right\|_2^2 + \lambda \sum_m \|x_m\|_1 \qquad (5)$$

where $\{d_m\}$ is a set of M dictionary filters, * denotes convolution, and $\{x_m\}$ is a set of coefficient maps, each of which is the same size as s. Here, s is a full image, and the set of dictionary filters $\{d_m\}$ is usually much smaller. For notational simplicity, s and $x_m$ are considered to be N dimensional vectors, where N is the number of pixels in an image, and the notation $\{x_m\}$ is adopted to denote all M of $x_m$ stacked as a single column vector. The derivations presented here are for a single image with a single color band, but the extension to multiple color bands for both image and filters and simultaneous sparse coding of multiple images is also possible. The extension to color and other multi-band images is mathematically straightforward, at the price of some additional notations.

The original algorithm proposed for convolutional sparse coding adopted a splitting technique with alternating minimization of two sub-problems—the first consisting of the solution of a large linear system via an iterative method and the second consisting of a simple shrinkage. The resulting alternating minimization algorithm is similar to one that would be obtained within an ADMM framework, but requires continuation on the auxiliary parameter that controls the strength of the additional term penalizing the violation of the constraint inherent in the splitting. All computation is performed in the spatial domain since it was expected that computation in the discrete Fourier transform (DFT) domain would result in undesirable boundary artifacts. The DFT converts a finite list of equally spaced samples of a function into a list of coefficients of a finite combination of complex sinusoids, ordered by their frequencies. DFTs convert the sampled function from its original domain, such as time or a position along a line, to the frequency domain, as is known. Other algorithms that have been proposed for this problem include coordinate descent and a proximal gradient method, both operating in the spatial domain.

Recently, an ADMM algorithm operating in the DFT domain has been proposed for dictionary learning for convolutional sparse representations. The use of fast Fourier transforms (FFTs) in solving the relevant linear systems has been shown to give substantially better asymptotic performance than the original spatial domain method. FFTs are algorithms that compute the DFT and its inverse, as is known. Also, evidence is presented to support the claim that the resulting boundary effects are not significant.

However, the computation time for solving for linear systems in this algorithm, which dominates the computational cost of the algorithm, is $\mathcal{O}(M^3N)$. This significant cost renders the algorithm inefficient and impractical for large values of M (i.e., dictionaries with a large number of filters), and is likely the reason that this form of sparse representation has received little attention for image processing applications. Accordingly, an improved, more efficient approach may be beneficial.

SUMMARY

Certain embodiments of the present invention may provide solutions to the problems and needs in the art that have not yet been fully identified, appreciated, or solved by conventional sparse coding algorithms. For example, some embodiments of the present invention pertain to application of a convolutional sparse coding algorithm that is derived within the ADMM framework and solves the main linear system in the frequency domain for a significant computational advantage over conventional algorithms. Efficient convolutional sparse coding may be derived within an ADMM framework using FFTs. Coefficient maps of a signal or image vector s may be determined using the derived efficient convolutional sparse coding. More specifically, coefficient maps $\{x_m\}$ in the frequency domain $\{\hat{x}_m\}$ may be computed using Eq. (31) below such that the coefficient maps are determined with an efficiency of O(MN log N), where N is the dimensionality of the data and M is the number of elements in the dictionary. The coefficient maps may be computed in the frequency domain using only inner products, element-wise addition, and scalar multiplication, avoiding slower matrix-vector operations.

In an embodiment, a computer-implemented method includes deriving efficient convolutional sparse coding in a frequency domain, by a computing system, within an alternating direction method of multipliers (ADMM) framework using fast Fourier transforms (FFTs). The computer-implemented method also includes determining, by the computing system, coefficient maps of a signal or image vector s using the derived efficient convolutional sparse coding. The computer-implemented method further includes outputting the coefficient maps, by the computing system, as a sparse representation of s when stopping criteria are met.

In another embodiment, a computer program is embodied on a non-transitory computer-readable medium. The program is configured to cause at least one processor to pre-compute fast Fourier transforms (FFTs) of $\{d_m\} \rightarrow \{\hat{D}_m\}$ and $s \rightarrow \hat{s}$, where $\{d_m\}$ is a filter dictionary and s is a signal or image vector and initialize $\{y_m\}=\{u_m\}=0$, where $\{y_m\}$ is a set of auxiliary variables and $\{u_m\}$ is a set of Lagrange multipliers. While stopping criteria are not met, the program is also configured to cause the at least one processor to compute FFTs of $\{y_m\} \rightarrow \{\hat{y}_m\}$, $\{u_m\} \rightarrow \{\hat{u}_m\}$, compute $\{\hat{x}_m\}$ using $$v_n = \rho^{-1}\left(b_n - \frac{a_n^H b_n}{\rho + a_n^H a_n} a_n\right),$$

compute inverse FFTs of $\{\hat{x}_m\} \rightarrow \{x_m\}$, set $\{y_m\} = \mathcal{S}_{\lambda/\rho}(\{x_m\}+\{u_m\})$ and $\{u_m\}=\{u_m\}+\{x_m\}-\{y_m\}$, and update $\rho$ when convergence to a desired accuracy has not occurred. The program is further configured to output coefficient maps $\{x_m\}$ as a sparse representation of s when the stopping criteria are met.

In yet another embodiment, a system includes memory storing computer program instructions and at least one processor configured to execute the stored computer program instructions. The at least one processor, by executing the stored computer program instructions, is configured to compute a dictionary in a frequency domain $\hat{g}_m \forall m$ using $\hat{y}_{k,m}$ as coefficient maps and using an iterated Sherman-Morrison algorithm for a dictionary update. The at least one processor is also configured to output a dictionary $\{g_m\}$ when stopping tolerances are met.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Figure 1:
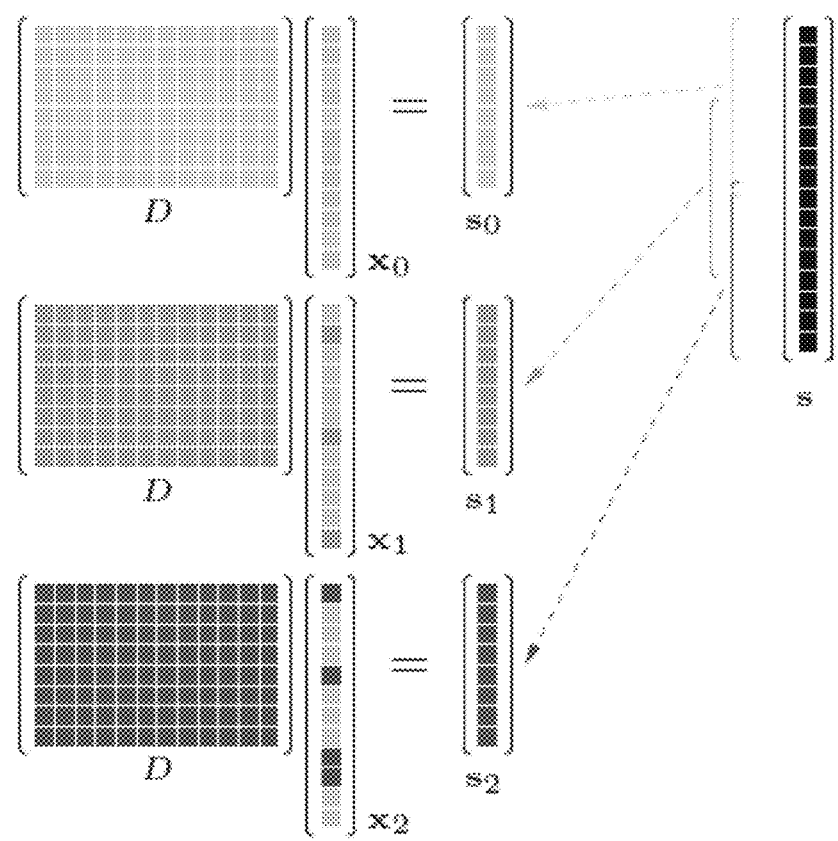
FIG. 1 is an independent sparse representation of overlapping blocks.
Figure 2:
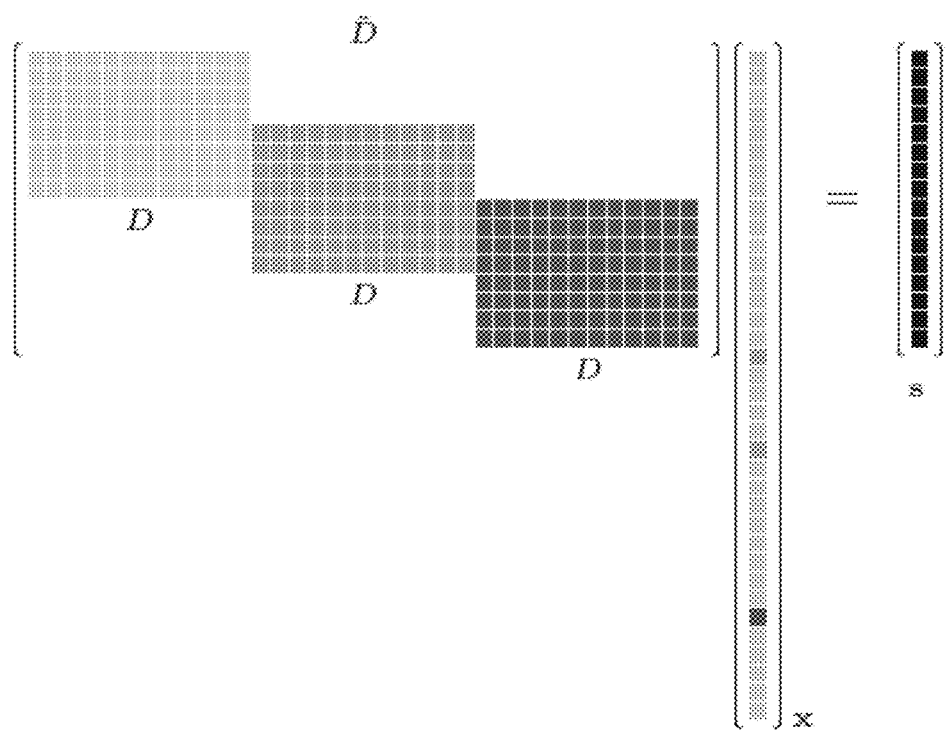
FIG. 2 is a jointly optimized sparse representation of overlapping blocks.
Figure 3:
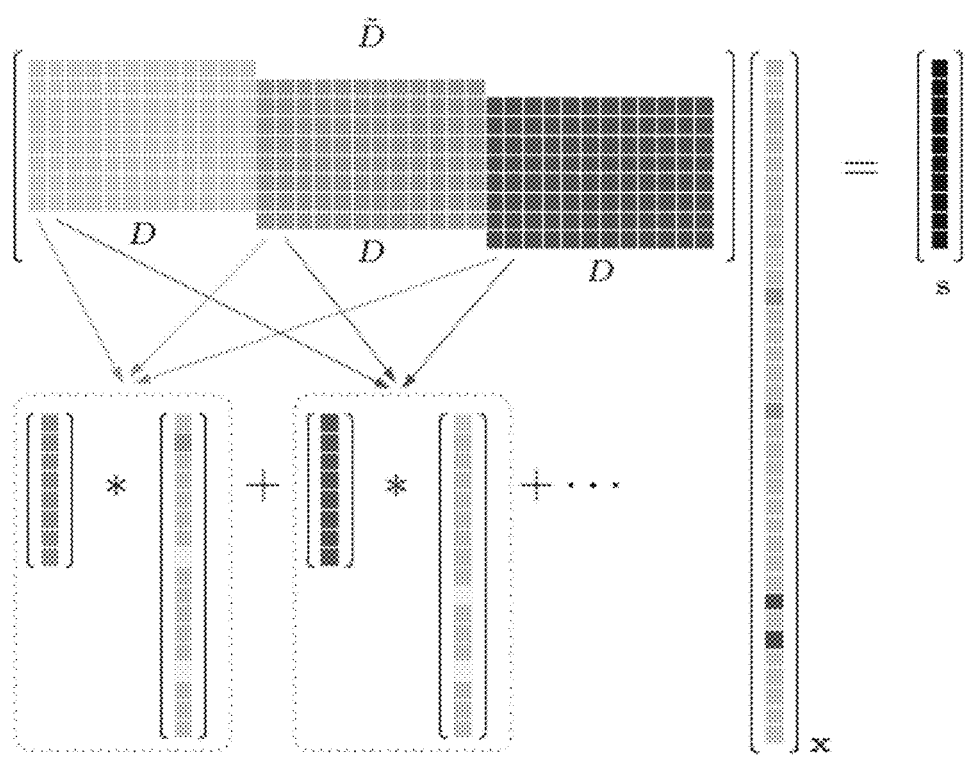
FIG. 3 illustrates equivalence between the jointly optimized sparse representation and a convolutional sparse representation.
Figure 4A:
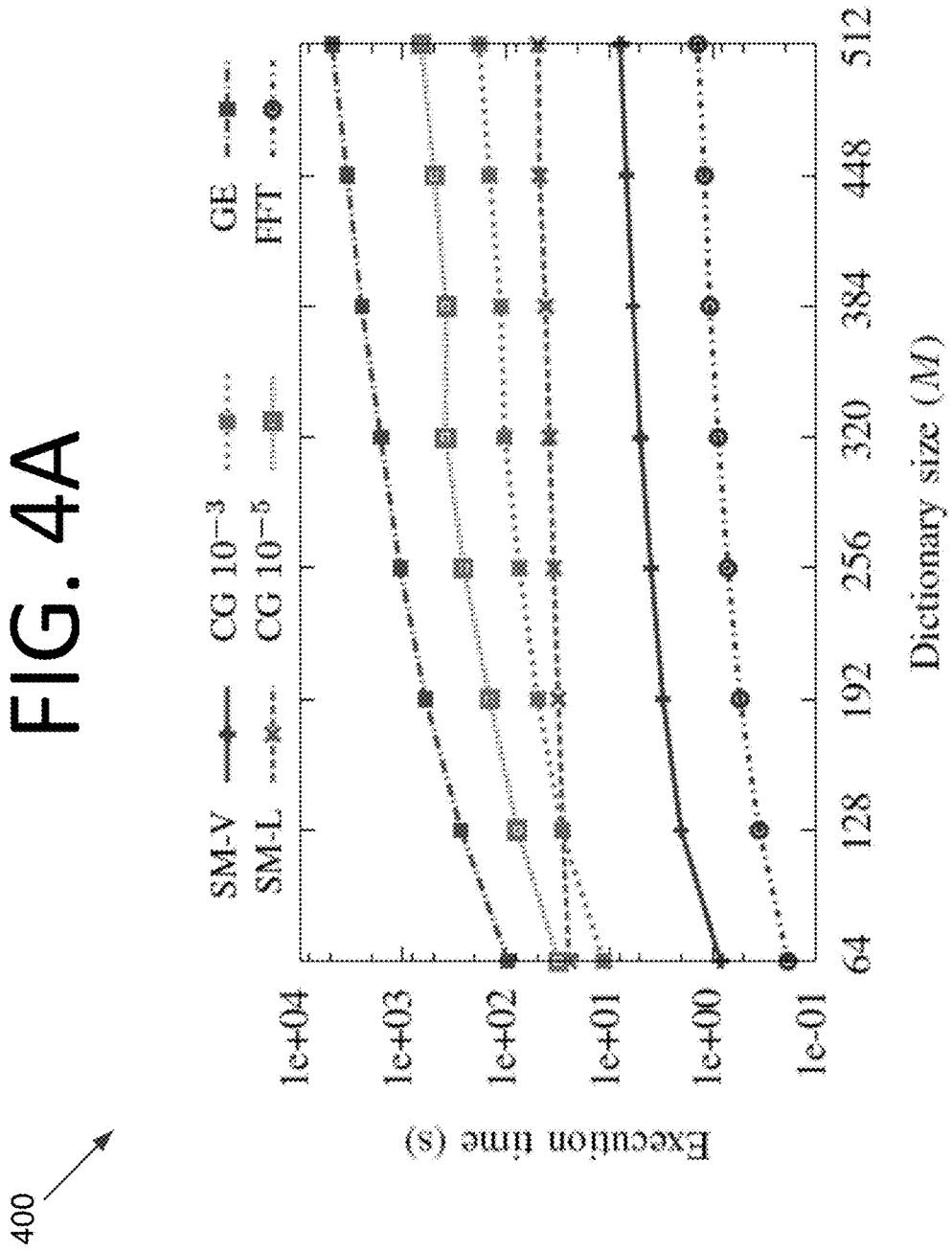
FIG. 4A is a graph illustrating the single precision execution times of solution methods for a range of dictionary sizes, according to an embodiment of the present invention.
Figure 4B:
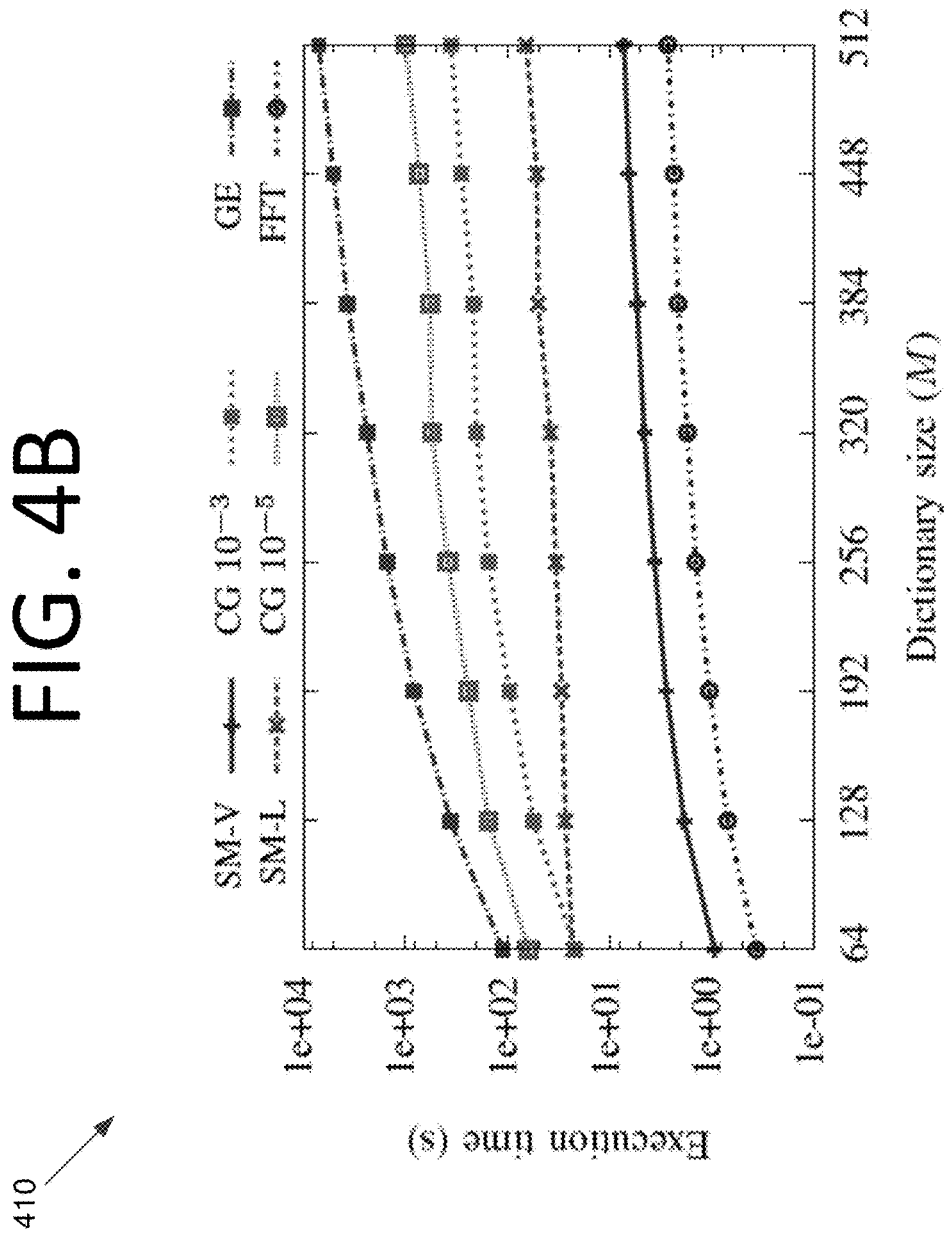
FIG. 4B is a graph illustrating the double precision execution times of solution methods for a range of dictionary sizes, according to an embodiment of the present invention.
Figure 4C:
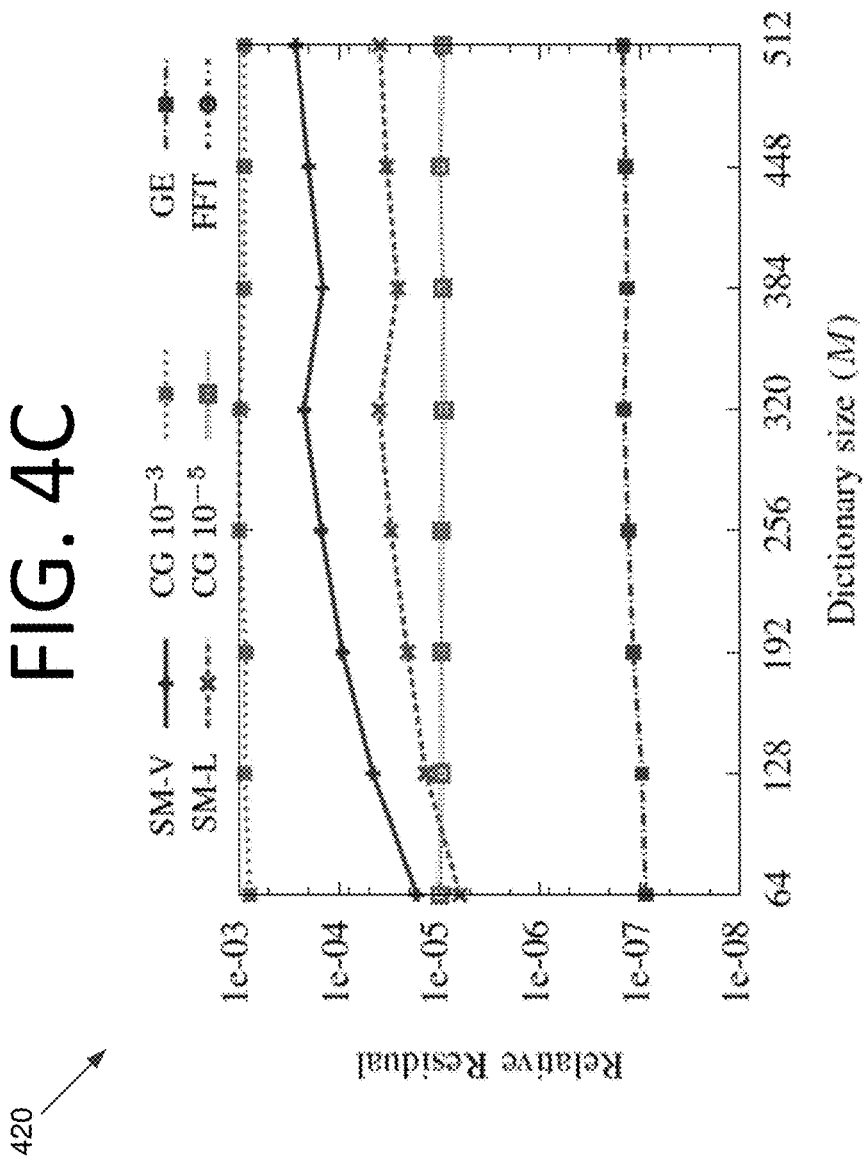
FIG. 4C is a graph illustrating the single precision relative residual solution errors of solution methods for a range of dictionary sizes, according to an embodiment of the present invention.
Figure 4D:
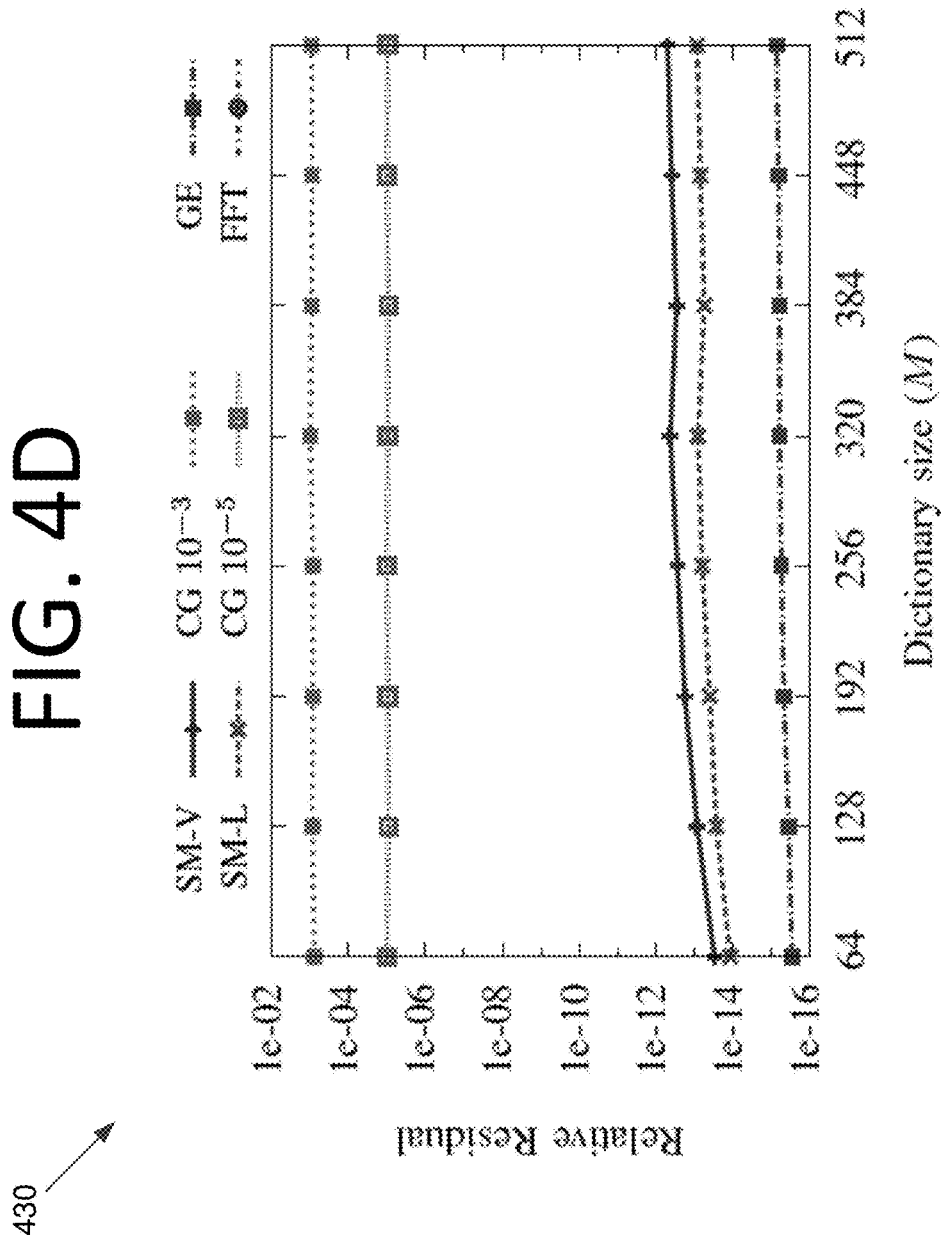
FIG. 4D is a graph illustrating the double precision relative residual solution errors of solution methods for a range of dictionary sizes, according to an embodiment of the present invention.

Some embodiments of the present invention pertain to fast algorithms for convolutional sparse coding that are derived within the ADMM framework and exploit FFT, as well as fast algorithms for dictionary learning. Such embodiments provide a significant computational advantage as compared with conventional algorithms. This is somewhat similar to the sparse coding component of the dictionary learning algorithm of Bristow et al., but introduces an approach for solving the linear systems that dominate the computational cost of the algorithm in time that is linear in the number of filters, instead of cubic (i.e., $\mathcal{O}(M^3N)$) in conventional techniques. See H. Bristow, A. Eriksson, and S. Lucey, "Fast Convolutional Sparse Coding," Proc. IEEE Conf. Comp. Vis. Pat. Recog. (CVPR), pp. 391-398 (June 2013). This significant improvement in efficiency may greatly increase the range of problems that can practically be addressed via convolutional sparse representations. Applications of the fast algorithms of some embodiments include, but are not limited to, computer vision problems (e.g., identifying objects in images), improving the quality of images (e.g., removing noise, repairing damage, etc.). Generally speaking, there are two parts to the process of some embodiments: (1) learn a model describing the data (i.e., "dictionary learning"); and (2) apply the model (i.e., "sparse coding").

The most expensive component is solving a very large linear system. A key insight that enables some embodiments to run orders of magnitude faster than conventional approaches is the realization that the matrices occurring in the frequency domain have a special structure that allows for a much faster solution. More specifically, the matrices that represent the dictionary in the frequency domain are block matrices where every block is a diagonal, as is described in more detail below.

In practice, some embodiments are 10-100 times faster than conventional approaches. Due to the improvements in speed presented by some embodiments, new supercomputers (e.g., high performance, multi-parallel cluster systems) may be able to process at least some classes of images in real time. With further advances in computing, real time applications may be possible generally. Parallelization is the key for this improvement, and real time applications are within the scope of the present disclosure.

ADMM Algorithm for Convolutional BPDN

Given the recent success of ADMM for the standard BPDN problem, it follows that ADMM may be considered for convolutional BPDN. The general outline of the method derived here is similar to the sparse coding component of the Augmented Lagrangian dictionary learning algorithm developed by Bristow et al. At a superficial level, the only difference is that for convolutional BPDN, the ADMM algorithm is derived in the spatial domain with one of the sub-problems being solved in the frequency domain, whereas the sparse coding component of the Augmented Lagrangian dictionary learning algorithm is directly derived using a mixture of spatial and frequency domain variables. A much more important difference and benefit of using the new ADMM algorithm in some embodiments for convolutional BPDN, however, is the use of a far more efficient method for solving the linear system that represents the bulk of the computational cost of the algorithm, which is a new way of solving the main sub-problem.

The ADMM iterations for solving the optimization $$\underset{x, y}{\arg\min} f(x) + g(y) \text{ such that } Ax + By + c \tag{6}$$

are, in scaled form, $$x^{(j+1)} = \underset{x}{\arg\min} f(x) + \frac{\rho}{2}\|Ax + By^{(j)} - c + u^{(j)}\|_2^2 \tag{7}$$

$$y^{(j+1)} = \underset{y}{\arg\min} g(y) + \frac{\rho}{2}\|Ax^{(j+1)} + By - c + u^{(j)}\|_2^2 \tag{8}$$

$$u^{(j+1)} = u^{(j)} + Ax^{(j+1)} + By^{(j+1)} - c \tag{9}$$

It is possible to rewrite Eq. (5) above in a form suitable for ADMM by introducing auxiliary variables $\{y_m\}$. The variables $\{y_m\}$, referred to in the plural since there is a set thereof indexed by m, can be thought of as copies of the main $\{y_m\}$ variables. The constraint $\{x_m\}-\{y_m\}=0$ ensures that the problem with these "copies" is equivalent to the original problem. However, the introduction of these copies makes it possible to try to solve the problem by an alternating minimization approach, holding $\{y_m\}$ constant and minimizing $\{x_m\}$, followed by minimizing $\{y_m\}$, then returning to $\{x_m\}$, and so on. In some cases, such as here, solving these two sub-problems turns out to be easier than solving the original problem. This yields $$\underset{\{x_m\}, \{y_m\}}{\arg\min} \frac{1}{2}\|\Sigma_m d_m * x_m - s\|_2^2 + \lambda \Sigma_m \|y_m\|_1 \tag{10}$$

such that $x_m - y_m = 0 \forall m$ for which the corresponding ADMM iterations with dual variables $\{y_m\}$ are $$\{x_m\}^{(j+1)} = \underset{\{x_m\}}{\arg\min} \frac{1}{2}\left\|\sum_m d_m * x_m - s\right\|_2^2 + \frac{\rho}{2}\sum_m \|x_m - y_m^{(j)} + u_m^{(j)}\|_2^2 \tag{11}$$

$$\{y_m\}^{(j+1)} = \underset{\{y_m\}}{\arg\min} \lambda \sum_M \|y_m\|_1 + \frac{\rho}{2}\sum_m \|x_m^{(j+1)} - y_m + u_m^{(j)}\|_2^2 \tag{12}$$

$$u_m^{(j+1)} = u_m^{(j)} + x_m^{(j+1)} - y_m^{(j+1)} \tag{13}$$

The set $\{u_m\}$ are Lagrange multipliers in the ADMM approach. This is a standard formulation that is known to those of ordinary skill in the art of optimization. ρ is the penalty parameter that plays a similar role to that discussed above. ρ controls the "strength" of the term that enforces the constraint that $\{x_m\}=\{y_m\}$, which is necessary for the split problem to be equivalent to the original one. ρ is an important algorithm parameter that ends up controlling how fast the iterative algorithm converges.

The sub-problem of Eq. (12) can be solved via shrinkage/soft thresholding as $$y_m^{(j+1)} = \mathcal{S}_{\lambda/\rho}(x_m^{(j+1)} + u_m^{(j)}) \tag{14}$$

where $$\mathcal{S}_\gamma(u) = \text{sign}(u) \odot \max(0, |u| - \gamma) \tag{15}$$

with sign(•) and |•| of a vector considered to be applied element-wise, and ⊙ denoting element-wise multiplication. The computational cost of this sub-problem is $\mathcal{O}(MN)$. The only computationally expensive step is solving Eq. (11), which is of the form $$\underset{\{x_m\}}{\arg\min} \frac{1}{2}\left\|\sum_m d_m * x_m - s\right\|_2^2 + \frac{\rho}{2}\sum_m \|x_m - z_m\|_2^2 \tag{16}$$

DFT Domain Formulation

It is possible to attempt to exploit the FFT for efficient implementation of the convolution via the DFT convolution theorem. This involves some increase in memory requirements since $d_m$ is zero-padded to the size of $x_m$ before application of the FFT.

Linear operators $D_m$ are defined such that $D_m x_m = d_m * x_m$, and the variables $D_m$, $x_m$, s, and $z_m$ are denoted in the DFT domain by $\hat{D}_m$, $\hat{x}_m$, $\hat{s}$, and $\hat{z}_m$, respectively. It can be shown via the DFT convolution theorem that Eq. (16) is equivalent to $$\underset{\{\hat{x}_m\}}{\arg\min} \frac{1}{2}\left\|\sum_m \hat{D}_m \hat{x}_m - \hat{s}\right\|_2^2 + \frac{\rho}{2}\sum_m \|\hat{x}_m - \hat{z}_m\|_2^2 \tag{17}$$

with the $\{x_m\}$ minimizing in Eq. (16) being given by the inverse DFT of the $\{\hat{x}_m\}$ minimizing in Eq. (17). By defining $$\hat{D} = (\hat{D}_0 \quad \hat{D}_1 \quad \ldots), \hat{x} = \begin{pmatrix} \hat{x}_0 \\ \hat{x}_1 \\ \vdots \end{pmatrix}, \hat{z} = \begin{pmatrix} \hat{z}_0 \\ \hat{z}_1 \\ \vdots \end{pmatrix} \tag{18}$$

this problem can be expressed as $$\underset{\{\hat{x}\}}{\arg\min} \frac{1}{2}\|\hat{D}\hat{x} - \hat{s}\|_2^2 + \frac{\rho}{2}\|\hat{x} - \hat{z}\|_2^2 \tag{19}$$

the solution being given by the linear system $$(\hat{D}^H \hat{D} + \rho I)\hat{x} = \hat{D}^H \hat{s} + \rho \hat{z} \tag{20}$$

Independent Linear Systems

Matrix $\hat{D}$ has a block structure consisting of M concatenated N×N diagonal matrices, where M is the number of filters and N is the number of samples in s. $\hat{D}^H \hat{D}$ is an MN×MN matrix, but due to the diagonal block (not block diagonal) structure of $\hat{D}$, a row of $\hat{D}^H$ with its non-zero element at column n will only have a non-zero product with a column of $\hat{D}$ with its non-zero element at row n. As a result, there is no interaction between elements of $\hat{D}$ corresponding to different frequencies, so that one need only solve N independent M×M linear systems to solve Eq. (20). The cost of the FFTs and solving these linear systems dominate the computational cost of the algorithm.

The previous approach of Bristow et al. did not specify how to solve these linear systems. However, since the computational cost of solving the linear systems is rated as $\mathcal{O}(M^3N)$, it can be concluded that a direct method, such as Gaussian elimination (GE), is applied. This can be effective when it is possible to precompute and store a lower upper (LU), which is a standard decomposition in linear algebra, or a Cholesky decomposition (or similar decomposition) of the system matrix. In the present case, such an approach is not practical, and generally impossible unless M is very small, due to the $\mathcal{O}(M^2N)$ memory requirement for storage of these decompositions. Nevertheless, this remains a reasonable approach for small values of M, with the only apparent alternative being an iterative method such as conjugate gradient (CG).

However, a careful analysis of the unique structure of this problem reveals that there is an alternative and vastly more effective solution. More specifically, there is a special structure to the matrices, which are block matrixes where every block is a diagonal. The $m^{th}$ block of the right hand side of Eq. (20) may be defined as $$\hat{r}_m = \hat{D}_m^H \hat{s} + \rho \hat{z}_m \quad (21)$$

so that $$\begin{pmatrix} \hat{r}_0 \\ \hat{r}_1 \\ \vdots \end{pmatrix} = \hat{D}^H \hat{s} + \rho \hat{z} \quad (22)$$

Denoting the $n^{th}$ element of a vector x by x(n) to avoid confusion between indexing of the vectors themselves and selection of elements of these vectors, define $$v_n = \begin{pmatrix} \hat{x}_0(n) \\ \hat{x}_1(n) \\ \vdots \end{pmatrix} \quad b_n = \begin{pmatrix} \hat{r}_0(n) \\ \hat{r}_1(n) \\ \vdots \end{pmatrix} \quad (23)$$

and define $a_n$ as the column vector containing all of the non-zero entities from column n of $\hat{D}^H$, that is $$\hat{D} = \begin{pmatrix} \hat{d}_{0,0} & 0 & 0 & \ldots & \hat{d}_{1,0} & 0 & 0 & \ldots \\ 0 & \hat{d}_{0,1} & 0 & \ldots & 0 & \hat{d}_{1,1} & 0 & \ldots \\ 0 & 0 & \hat{d}_{0,2} & \ldots & 0 & 0 & \hat{d}_{1,2} & \ldots \\ \vdots & \vdots & \vdots & \ddots & \vdots & \vdots & \vdots & \ddots \end{pmatrix} \quad (24)$$

then $$a_n = \begin{pmatrix} \hat{d}_{0,n}^* \\ \hat{d}_{1,n}^* \\ \vdots \end{pmatrix} \quad (25)$$

where * denotes complex conjugation. The linear system to solve corresponding to an element n of $\{x_m\}$ is $$(a_n a_n^H + \rho I) v_n = b_n \quad (26)$$

The independent systems have a left hand side consisting of a diagonal matrix plus a rank-one component, which can be solved very efficiently by the Sherman-Morrison formula $$(A + uv^H)^{-1} = A^{-1} - \frac{A^{-1} uv^H A^{-1}}{1 + u^H A^{-1} v} \quad (27)$$

which yields $$(\rho I + aa^H)^{-1} = \rho^{-1}\left(I - \frac{aa^H}{\rho + a^H a}\right) \quad (28)$$

so that the solution to Eq. (26) is $$v_n = \rho^{-1}\left(b_n - \frac{a_n^H b_n}{\rho + a_n^H a_n} a_n\right) \quad (29)$$

The only vector operations are scalar multiplication, subtraction, and inner products, rendering this method $\mathcal{O}(M)$ instead of $\mathcal{O}(M^3)$ as in Eq. (20). The cost of solving such a system at all N frequency indices is $\mathcal{O}(MN)$, and the cost of the FFTs is $\mathcal{O}(MN \log N)$. The cost of the FFTs dominates the computational complexity, whereas in Eq. (20), the cost of the solutions of the linear systems in the DFT domain dominates the cost of the FFTs.

This approach can be implemented in an interpreted language such as Matlab™ in a form that avoids explicit iteration (i.e., loops) over the N frequency indices by passing data for all N frequency indices as a single array to the relevant linear-algebraic routines, commonly referred to as "vectorization" in Matlab™ terminology. Some additional computation time improvement is possible, at the cost of additional memory requirements, by precomputing components of Eq. (28), e.g., $a_n^H/(\rho + a_n^H a_n)$.

ADMM Algorithm Summary for Convolutional BPDN

An ADMM algorithm for Convolutional BPDN according to some embodiments is summarized below. Some typical values for the penalty auto-update parameters in some embodiments are $J_p = 1$, $\mu = 10$, and $\tau = 2$. A subscript indexed variable written without the superscript denotes the entire set of vectors concatenated as a single vector, e.g., x denotes the vector constructed by concatenating all vectors $x_m$.

---

Input: image s (N pixels), filter dictionary $\{d_m\}$ (M filters), regularization
parameter $\lambda$, initial penalty parameter $\rho_0$, penalty auto-update parameters
$J_p$, $\mu$, $\tau$, relaxation parameter $\alpha$, maximum iterations $J_{max}$, and absolute
and relative stopping tolerances $\epsilon_{abs}$, $\epsilon_{rel}$
Precompute: $\hat{s} = \text{FFT}(s)$, $\hat{D}_m = \text{FFT}(d_m) \forall m$
Initialize: $y_m = y_m^{prev} = u_m = 0 \; \forall m, \rho = \rho_0, j = 1$
repeat
  $\hat{z}_m = \text{FFT}(y_m - u_m) \; \forall m$
  compute $\hat{x}_m \; \forall m$ as in Eq. (21)-(29)
  $x_m = \text{IFFT}(\hat{x}_m)$
  $x_{relax,m} = \alpha x_m + (1 - \alpha) y_m \; \forall m$
  $y_m = S_{\lambda/\rho}(x_{relax,m} + u_m) \; \forall m$
  $u_m = u_m + x_{relax,m} - y_m \; \forall m$
  $r = \|x - y\|_2$
  $s = \rho \|y^{prev} - y\|_2$
  $\epsilon_{pri} = \epsilon_{abs} \sqrt{MN} + \epsilon_{rel} \max\{\|x\|_2, \|y\|_2\}$
  $\epsilon_{dua} = \epsilon_{abs} \sqrt{MN} + \epsilon_{rel} \rho \|u\|_2$
  $y_m^{prev} = y_m \; \forall m$
  if $j \neq 1$ and $j \bmod J_p = 0$ then
    if $r > \mu s$ then
      $\rho = \tau \rho$ -continued

```
        u_m = u_m/τ ∀m
     else if s > μr then
        ρ = ρ/τ
        u_m = τu_m ∀m
     end
  end
  j = j + 1
until j > J_max or (r ≤ ε_pri and s ≤ ε_dua)
Output: coefficient maps y_m
```

The computational cost of the algorithm components is O(MN log N) for the FFTs, order O(MN) for the proposed linear solver, and O(MN) for both the shrinkage and dual variable update. Thus, the entire cost of the algorithm is O(MN log N), dominated by the cost of the FFTs.

In contrast, the cost of the algorithm of Bristow et al. is $O(M^3N)$, which tends to be computationally expensive for a practical sized dictionary. There is also a O(MN log N) cost for FFTs under conventional approaches, but it is dominated by the $O(M^3N)$ cost of the linear solver, and the cost of the original spatial-domain algorithm in conventional approaches is $O(M^2N^2L)$, where L is the dimensionality of the filters.

Performance Comparison: Linear Solvers for ADMM

The execution times and solution accuracies of four different methods of solving the linear system are compared in graphs 400, 410, 420, 430 of FIGS. 4A-D, respectively. Computations were performed in both single and double precision arithmetic to allow evaluation of the corresponding execution time and solution accuracy tradeoff. Dictionaries of different sizes were constructed by selecting subsets of a 12×12×512 dictionary (12×12 filters) learned using standard (nonconvolutional) methods, and s was the 512×512 grayscale Lena image. λ was set to 0.01. The solution methods are Gaussian elimination (GE), Conjugate Gradient (CG) with relative residual tolerances of $10^{-3}$ and $10^{-5}$, and Sherman-Morrison implemented with a loop over each spatial location (SM-L) or jointly over all spatial locations (SM-V). The combined runtime for a forward and inverse FFT is provided as a reference.

After an initial 20 iterations of the ADMM algorithm to avoid any unique characteristics of the linear system directly after initialization of the iterations, the four different methods were used to solve Eq. (20) for the following iteration, recording the time required by each method. Reconstruction error was computed as the relative residual error with which solution $\hat{x}$ satisfied the linear equation of Eq. (20). The relative residual error of x in the linear equation Ax=b is $\|Ax-b\|_2/\|b\|_2$.

Figure 5:
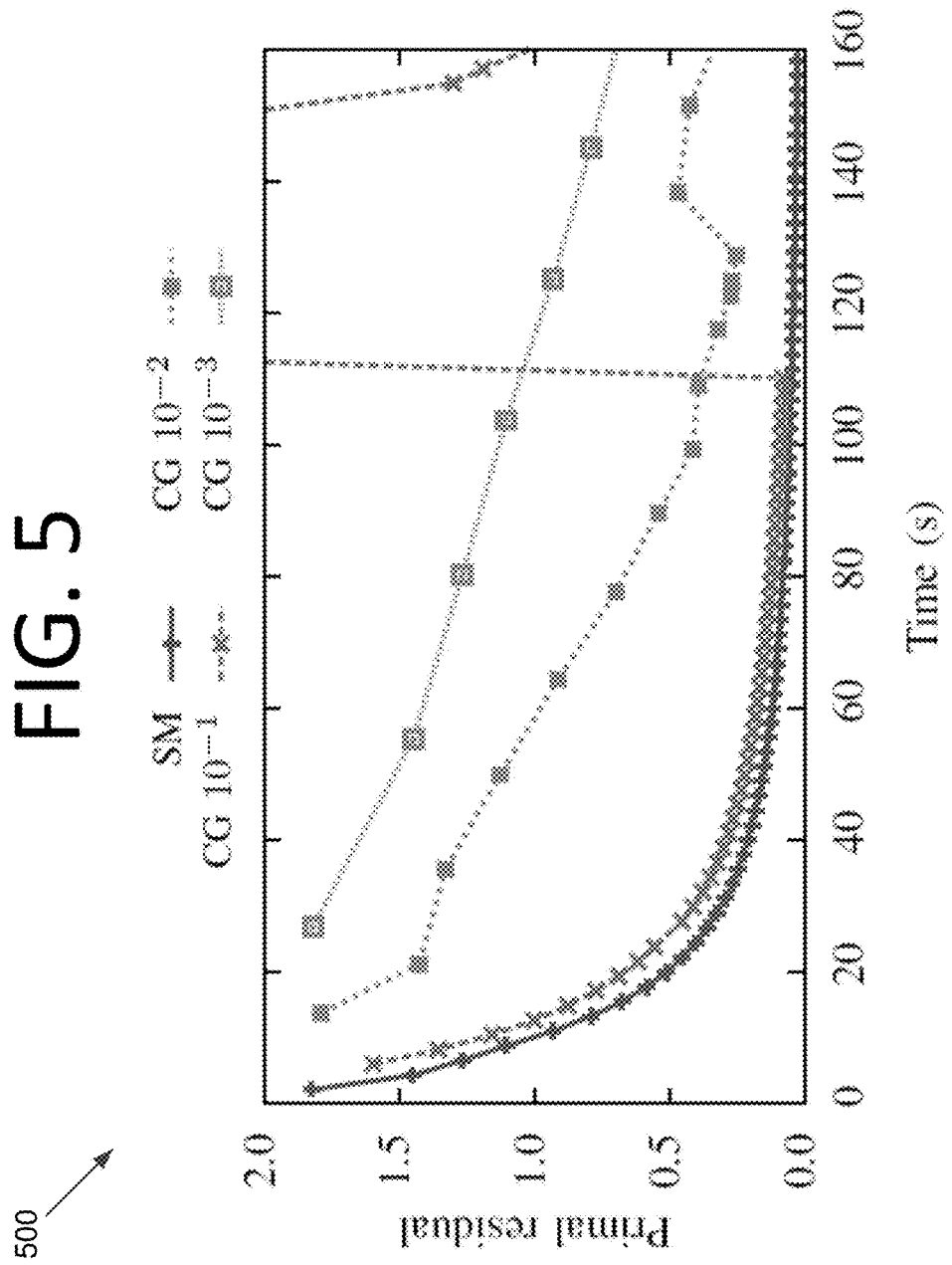
FIG. 5 is a graph illustrating a comparison of primal residual evolution with time for the ADMM algorithm with Eq. (19) solved in single precision using Sherman-Morrison and CG with three different relative residual tolerances, according to an embodiment of the present invention.

A corresponding comparison for a double precision solution for these systems is presented here in graph 500 of FIG. 5. From the results, it can be seen that the variation in execution times between single and double precision is far smaller than the variation between the different solution methods. SM-V runtime has very small variation with precision, while CG can be almost twice as slow in double precision as in single precision, and GE run time dependence on precision increases with M. The variation in execution times between single and double precision is far smaller than the variation between the different solution methods.

SM-V runtime has very small variation with precision, while CG can be almost twice as slow in double precision as in single precision, and GE runtime dependence on precision increases with M. GE gives solutions accurate to floating point precision, but is the slowest of all the methods, being vastly slower than SM-V, and having much worse scaling with M. CG provides a better accuracy/time trade-off than GE, being substantially faster, while still providing solutions of acceptable accuracy. SM-V is by far the fastest method, giving acceptable solution accuracy in single precision, and very high accuracy in double precision. The negligible variation in run time with precision suggests that use of a double precision solution might be preferred, but empirical evidence (see below) indicates that, in practice, the single precision solution accuracy is sufficient, and gives approximately the same rate of convergence for the ADMM algorithm as double precision solution.

Figure 6:
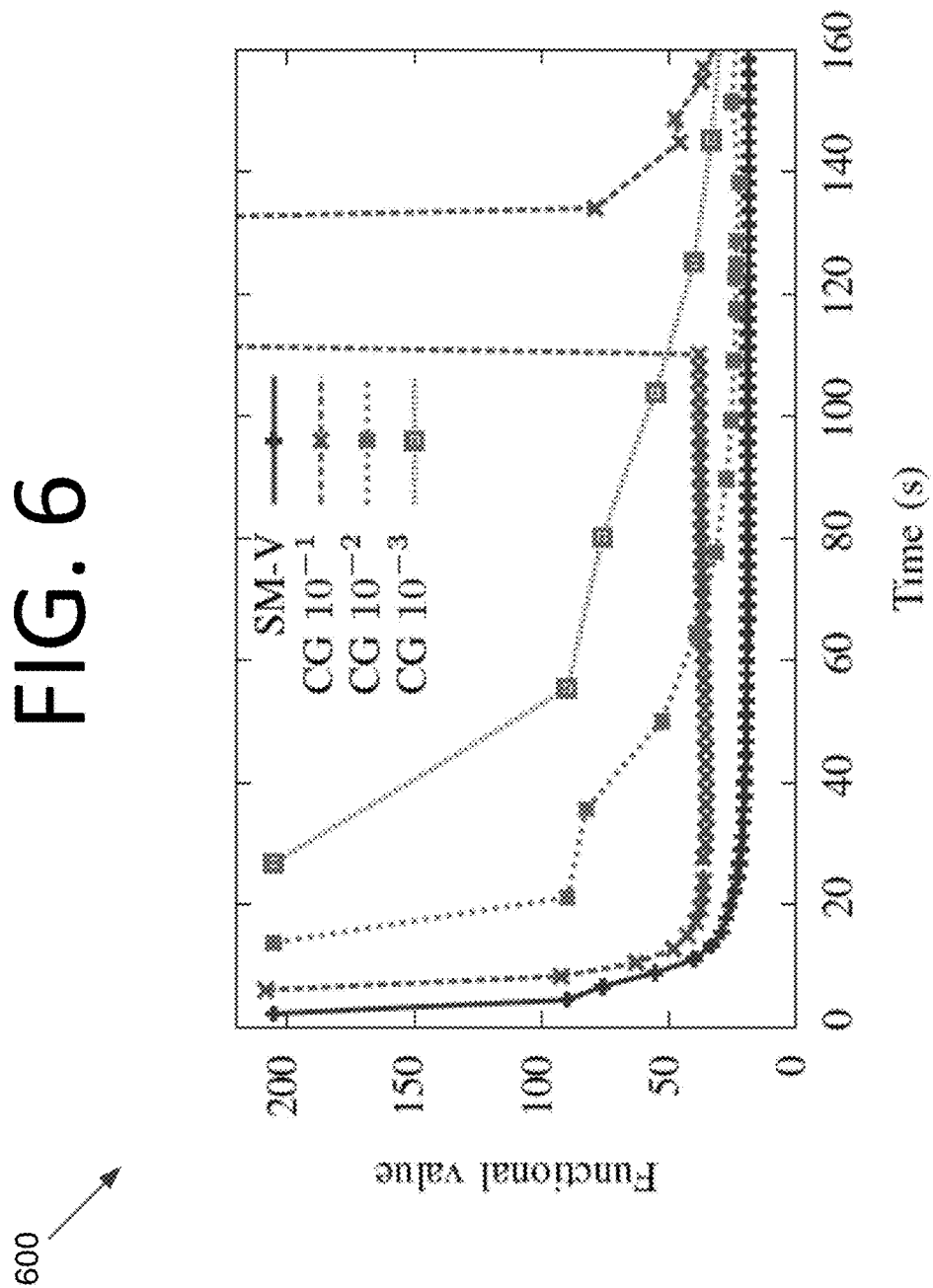
FIG. 6 is a graph illustrating a comparison of functional value evolution with time for the ADMM algorithm with Eq. (20) solved in single precision using Sherman-Morrison and CG with three different relative residual tolerances, according to an embodiment of the present invention.

Since these methods all exhibit a different trade-off between accuracy and speed, it is reasonable to investigate what the effect is on algorithm performance. It is not worth expending a large amount of time to compute a very accurate solution since ADMM algorithms only require approximate solutions of each step, but convergence will be slow or unreliable if the solutions are sufficiently inaccurate. The results presented in graph 600 of FIG. 6 show that SM-V gives a faster reduction in functional value with time than CG with any choice of tolerance, even for the smallest M considered in FIGS. 4A-D. The 512×512 grayscale Lena test image was used with a learned 8×8×64 dictionary and λ=0.01.

In an ADMM algorithm such as this, different functional values will be obtained depending on whether the functional values are computed using the primary ($\{x_m\}$) or auxiliary ($\{y_m\}$) variable. The auxiliary $\{y_m\}$ is used for the experiments reported here since: (1) $\{x_m\}$ is merely an intermediate result and not part of the algorithm state; and (2) it has been found empirically to give a curve that decays faster and is less subject to oscillations. Smaller CG tolerances than in FIGS. 4A-D are used in FIG. 6 since it is already clear from FIGS. 4A-D that tolerances smaller than $10^{-3}$ are not competitive.

In this case, CG with a relative residual tolerance of $10^{-1}$ is not much slower than SM-V, but the algorithm does not converge. Larger tolerance values give a more reliable decrease in functional value with each iteration, but are much slower. It should be noted that on a longer timescale than that displayed in FIG. 6, CG with tolerances of $10^{-2}$ and $10^{-3}$ also begins to exhibit some oscillations. If plotted on the same graph, the double precision SM-V result is indistinguishable from the single precision SM-V result, as shown.

Dictionary Learning

The extension of Eq. (5) to learning a dictionary from training data involves replacing the minimization with respect to $x_m$ with minimization with respect to both $x_m$ and $d_m$. The optimization is performed via alternating minimization between the two variables, the most common approach consisting of a sparse coding step followed by a dictionary update. The commutativity of convolution suggests that the DFT domain solution discussed above can be directly applied in minimizing with respect to $d_m$ instead of $x_m$. However, this is not possible since $d_m$ is of constrained size and must be zero-padded to the size of $x_m$ prior to a DFT domain implementation of the convolution.

If the size constraint is implemented in an ADMM framework, however, the problem is decomposed into a computationally cheap sub-problem corresponding to a projection onto a constraint set and another sub-problem that can be efficiently solved by extending the approach discussed above. This iterative algorithm for the dictionary update can alternate with a sparse coding stage to form a more traditional dictionary learning method, or the sub-problems of the sparse coding and dictionary update algorithms can be combined into a single ADMM algorithm.

In contrast to standard sparse representations, it is possible to define the convolutional dictionary learning problem in the Single Measurement Vector (SMV) case, but for full generality, it should be construed in the Multiple Measurement Vector (MMV) context. Including the usual constraint on the norm of dictionary elements, the problem can be expressed as $$\operatorname*{argmin}_{\{d_m\},\{x_{k,m}\}} \frac{1}{2} \sum_k \left\| \sum_m d_m * x_{k,m} - s_k \right\|_2^2 + \lambda \sum_k \sum_m \|x_{k,m}\|_1 \quad (30)$$

such that (31)

$$\|d_m\|_2 = 1 \forall m$$

The standard approach is to solve via alternating minimization with respect to $\{x_{k,m}\}$ and $\{d_m\}$. The minimization with respect to $\{x_{k,m}\}$ involves solving the MMV extension of Convolutional BPDN, which is trivial since the problems for each k are decoupled from one another, but $\{d_m\}$ is more challenging since the problems for different k are coupled.

Ignoring the constraint on the norm of $d_m$, which is usually applied as a post-processing normalization step after the update, the minimization with respect to $\{d_m\}$ can be expressed as $$\operatorname*{argmin}_{\{d_m\}} \frac{1}{2} \sum_k \left\| \sum_m d_m * x_{k,m} - s_k \right\|_2^2 \quad (32)$$

which is a convolutional form of the Method of Optimal Directions (MOD). When computing the convolutions $d_m * x_{k,m}$ in the DFT domain, there is an implicit zero-padding of the filters $d_m$ to the size of the coefficient maps $x_{k,m}$. This can be overlooked when minimizing with respect to the coefficient maps, but must be explicitly represented when minimizing with respect to the filters to ensure that the filters resulting from the optimization have an appropriately constrained support in the spatial domain. Defining zero-padding operator P, Eq. (32) can be expressed in the DFT domain as $$\operatorname*{argmin}_{\{d_m\}} \frac{1}{2} \sum_k \left\| \sum_m (\tilde{P}\mathbf{d}_m^-) \odot \hat{x}_{k,m} - \hat{s}_k \right\|_2^2 \quad (33)$$

Unfortunately, the spatial-domain operator P does not have a compact representation in the DFT domain, making an efficient direct DFT domain solution impossible. A variable splitting approach, however, makes it possible to solve this problem, including dictionary norm constraints, via an ADMM algorithm.

Constrained MOD Update

The desired filters can be obtained as $P^T d_m$ after solving the constrained problem $$\operatorname*{argmin}_{\{d_m\}} \frac{1}{2} \sum_k \left\| \sum_m x_{k,m} * d_m - s_k \right\|_2^2 \quad (34)$$

such that $$d_m \in C_P \forall m$$

where the $d_m$ have the same spatial support as the $x_{k,m}$, and $$C_P = \{x \in \mathbb{R}^N : (I - PP^T)x = 0\} \quad (35)$$

Since a constrained problem requiring an iterative solution is being setup, however, it is reasonable to also include the normalization $\|d_m\|_2 = 1$ or $\|d_m\|_2 \leq 1$ of the dictionary elements that is often, and suboptimally, performed as a postprocessing step after the dictionary update. Including the normalization requirement $\|d_m\|_2 = 1$, the constraint set becomes $$C_{PN} = \{x \in \mathbb{R}^N : (I - PP^T)x = 0, \|x\|_2 = 1\} \quad (36)$$

Employing the indicator function $\iota_{C_{PN}}$ of the constraint set $C_{PN}$, the constrained problem can be written in unconstrained form $$\operatorname*{argmin}_{\{d_m\}} \frac{1}{2} \sum_k \left\| \sum_m x_{k,m} * d_m - s_k \right\|_2^2 + \sum_m \iota_{C_{PN}}(d_m) \quad (37)$$

and rewriting with an auxiliary variable in a form suitable for ADMM gives $$\operatorname*{argmin}_{\{d_m\}} \frac{1}{2} \sum_k \left\| \sum_m x_{k,m} * d_m - s_k \right\|_2^2 + \sum_m \iota_{C_{PN}}(g_m) \quad (38)$$

such that $$d_m - g_m = 0 \forall m$$

The indicator function of a set S is defined as $$\iota_S = \begin{cases} 0 & \text{if } X \in S \\ \infty & \text{if } X \notin S \end{cases} \quad (39)$$

This problem can be solved via an ADMM algorithm $$\{d_m\}^{(j+1)} = \quad (40)$$

$$\operatorname*{argmin}_{\{d_m\}} \frac{1}{2} \sum_k \left\| \sum_m x_{k,m} * d_m - s_k \right\|_2^2 + \frac{\rho}{2} \sum_m \|d_m - g_m^{(j)} - h_m^{(j)}\|_2^2$$

$$\{g_m\}^{(j+1)} = \operatorname*{argmin}_{\{g_m\}} \sum_m \iota_{C_{PN}}(g_m) + \frac{\rho}{2} \sum_m \|d_m^{(j+1)} - g_m - h_m^{(j)}\|_2^2 \quad (41)$$

$$h_m^{(j+1)} = h_m^{(j)} + d_m^{(j+1)} - g_m^{(j+1)} \quad (42)$$

The $\{g_m\}$ update is of the form $$\operatorname*{argmin}_x \frac{1}{2} \|x - y\|_2^2 + \iota_{C_{PN}}(x) = \operatorname{prox}_{\iota_{C_{PN}}}(y) \quad (43)$$

It is clear from the geometry of the problem that $$prox_{\iota_{C_{PN}}}(y) = \frac{PP^T y}{\|PP^T y\|_2} \quad (44)$$

or, if the normalization $\|d_m\|_2 \leq 1$ is desired instead, $$prox_{\iota_{C_{PN}}}(y) = \begin{cases} PP^T y & \text{if } \|PP^T y\|_2 \leq 1 \\ \frac{PP^T y}{\|PP^T y\|_2} & \text{if } \|PP^T y\|_2 > 1 \end{cases} \quad (45)$$

The problem for the $\{d_m\}$ update is of the form $$\operatorname*{argmin}_{\{d_m\}} \frac{1}{2} \sum_k \left\| \sum_m x_{k,m} * d_m - s_k \right\|_2^2 + \frac{\sigma}{2} \sum_m \|d_m - z_m\|_2^2 \quad (46)$$

In the DFT domain, where $\hat{X}_{k,m} = \operatorname{diag}(\hat{x}_{k,m})$, this becomes $$\operatorname*{argmin}_{\{d_m\}} \frac{1}{2} \sum_k \left\| \sum_m \hat{X}_{k,m} * \hat{d}_m - \hat{s}_k \right\|_2^2 + \frac{\sigma}{2} \sum_m \|\hat{d}_m - \hat{z}_m\|_2^2 \quad (47)$$

Defining $$X_k = (X_{k,0} \ X_{k,1} \ \cdots), \quad \hat{d} = \begin{pmatrix} \hat{d}_0 \\ \hat{d}_1 \\ \vdots \end{pmatrix} \quad \hat{z} = \begin{pmatrix} \hat{z}_0 \\ \hat{z}_1 \\ \vdots \end{pmatrix} \quad (48)$$

this problem can be expressed as $$\operatorname*{argmin}_{\hat{d}} \frac{1}{2} \sum_k \|\hat{X}_k \hat{d} - \hat{s}_k\|_2^2 + \frac{\sigma}{2} \|\hat{d} - \hat{z}\|_2^2 \quad (49)$$

with the solution $$\left( \sum_k \hat{X}_k^H \hat{X}_k + \sigma I \right) \hat{d} = \sum_k \hat{X}_k^H \hat{s}_k + \sigma \hat{z} \quad (50)$$

This linear system can be solved by iterated application of the Sherman-Morrison formula. The separable components of Eq. (50) are of the form $$(J + a_0 a_0^H + a_1 a_1^H + \ldots + a_K a_K^H) x = b \quad (51)$$

Define $A_0 = J$ and $A_{k+1} = A_k + a_k a_k^H$. Application of the Sherman-Morrison formula yields $$A_{k+1}^{-1} = (A_k + a_k a_k^H)^{-1} = A_k^{-1} - \frac{A_k^{-1} a_k a_k^H A_k^{-1}}{1 + a_k^H A_k^{-1} a_k} \quad (52)$$

Now define $\alpha_{l,k} = A_l^{-1} a_k$ and $\beta_k = A_k^{-1} b$ such that $\alpha_{0,k} = J^{-1} a_k$ and $\beta_0 = J^{-1} b$, so that $$\beta_{k+1} = A_k^{-1} b \quad (53)$$

$$= A_k^{-1} b - \frac{A_k^{-1} a_k a_k^H A_k^{-1} b}{1 + a_k^H A_k^{-1} a_k} \quad (54)$$

$$= \beta_k - \frac{\alpha_{k,k} a_k^H \beta_k}{1 + a_k^H \alpha_{k,k}} \quad (55)$$

and $$\alpha_{l+1,k} = A_{l+1}^{-1} a_k \quad (56)$$

$$= A_l^{-1} a_k - \frac{A_l^{-1} a_l a_l^H A_l^{-1} a_k}{1 + a_l^H A_l^{-1} a_l} \quad (57)$$

$$= \alpha_{l,k} - \frac{\alpha_{l,l} a_l^H \alpha_{l,k}}{1 + a_l^H \alpha_{l,k}} \quad (58)$$

An iterative algorithm to compute the solution for the system of Eq. (51), given by $\beta_K$, may be derived from these equations. An algorithm for solving Eq. (51) when $J = \rho I$ is presented below.

---

Input: vectors $\{a_k\}$, parameter $\rho$
Initialize: $\alpha = \rho^{-1} a_0$, $\beta = \rho^{-1} b$
for $k \in \{1 \ldots K\}$ do
$\quad \gamma_{k-1} = \frac{\alpha}{1 + a_{k-1}^H \alpha}$
$\quad \beta = \beta - \gamma_{k-1} a_{k-1}^H \beta$
$\quad$ if $k \leq K - 1$ then
$\quad\quad \alpha = \rho^{-1} a_k$
$\quad\quad$ for $l \in \{1 \ldots K\}$ do
$\quad\quad\quad \alpha = \alpha - \gamma_{l-1} a_{l-1}^H \alpha$
$\quad\quad$ end
$\quad$ end
end
Output: linear equation solution $\beta$

---

Alternatively, other equivalent solutions for iterative application of the Sherman-Morrison formula may be applied, such as that proposed by N. Egidi and P. Maponi in "A Sherman-Morrison Approach to the Solution of Linear Systems," Journal of Computational and Applied Mathematics, vol. 189, no. 1-2, pp. 703-718 (May 2006).

Interleaved $x_{k,m}$ and $d_m$ Updates

Given iterative algorithms for the $x_{k,m}$ and $d_m$ updates (i.e., the ADMM algorithms for Convolutional BPDN and Constrained MOD respectively), the immediate question is how these should be combined into a full dictionary learning algorithm. The standard approach is to alternate between sparse coding and dictionary update, solving the sparse coding problem with reasonable accuracy before moving on to the dictionary update. Since each sub-problem is an iterative algorithm, this would entail performing multiple iterations of each sub-problem before switching to the other. A reasonable strategy is to maintain the auxiliary variables for each sub-problem across the top-level iterations since performing a cold start at each switch of sub-problems would entail substantially reduced efficiency. The necessity of retaining these variables, in turn, suggests interleaving the ADMM iterations for each sub-problem into a single set of iterations, rather than combining the $x_{k,m}$ and $d_m$ updates in a way that treats each as a single functional unit. This general strategy, of interleaving the algorithms for sparse code and dictionary updates, has previously been proposed, but with substantially different algorithms for each update. A single iteration of the resulting algorithm consists of updates Eq. (11), (12), (13), (40), (41), and (42) in sequence.

The most obvious way of combining these updates is to transfer the primary variables across to the other update steps, i.e., $d_m$ represent the dictionary in the sparse coding steps and $x_{k,m}$ represent the sparse code in the dictionary update steps. Such a combination turns out to be quite unstable in practice, with convergence being very sensitive to suitable choices of the $\rho$ and $\sigma$ parameters for each update. A far more stable algorithm is obtained if the updates are interleaved on their auxiliary variables, i.e., $g_m$ represent the dictionary in the sparse coding steps, and $y_{k,m}$ represent the sparse code in the dictionary update steps. It is worth noting that such a combination is not derivable from single Augmented Lagrangian functional. Additional differences in derivation and algorithm from Bristow et al. include that the Augmented Lagrangian is constructed using a mixture of spatial and frequency domain variables, while the derivation presented here presents the problem in the spatial domain, switching into the frequency domain where appropriate for efficient solution of relevant sub-problems. Also, the ADMM algorithm from Bristow et al. is derived in unscaled rather than scaled form. These choices appear to lead to a slightly more complicated path to deriving solutions to at least one of the sub-problems.

Dictionary Learning Algorithm Summary

The entire algorithm for Convolutional BPDN, including dictionary learning, in some embodiments is summarized below. A subscript indexed variable written without the subscript denotes the entire set of vectors concatenated as a single vector, e.g., x denotes the vector constructed by concatenating all vectors $x_{k,m}$.

---

Input: images $s_k$ (K images of N pixels each), initial dictionary $d^0_m$ (M filters), regularization parameter $\lambda$, initial penalty parameters $\sigma_0$, $\rho_0$, penalty auto-update parameters $J_{x,p}$, $\mu_x$, $\tau_x$, $J_{d,p}$, $\mu_d$, $\tau_d$, relaxation parameters $\alpha_x$, $\alpha_d$, maximum iterations $J_{max}$, and absolute and relative stopping tolerances $\epsilon_{abs}$, $\epsilon_{rel}$
Precompute: $\hat{s}_k = FFT(s_k) \; \forall k$
Initialize: $y_{km} = y^{prev}_{k,m} = u_{k,m} = 0 \; \forall k, m \; h_m = 0 \; g^{prev}_m = d^0_m \; \forall m, \rho = \rho_0, \sigma = \sigma_0, j = 1$
repeat
  $\hat{g}_m = FFT(g_m) \; \forall m$
  $\hat{z}_{k,m} = FFT(y_{k,m} - u_{k,m}) \; \forall k, m$
  Compute $\hat{x}_{k,m} \; \forall k,m$ as in Eq. (16)-(29) using $\hat{g}_{k,m}$ as the dictionary
  $x_{k,m} = IFFT(\hat{x}_{k,m})$
  $x_{relax,k,m} = \alpha_x x_{k,m} + (1 - \alpha_x) y_{k,m} \; \forall k, m$
  $y_{k,m} = S_{\lambda/\rho}(x_{relax,k,m} + u_{k,m}) \; \forall k, m$
  $u_{k,m} = u_{k,m} + x_{relax,k,m} - y_{k,m} \; \forall k, m$
  $\hat{y}_{k,m} = FFT(y_{k,m}) \; \forall k, m$
  $\hat{z}_m = FFT(g_m - h_m) \; \forall m$
  Compute $d_m \; \forall m$ as in Eq. (46)-(58) using $\hat{y}_{k,m}$ as the coefficient maps
  $d_m = IFFT(\hat{d}_m)$
  $d_{relax,m} = \alpha_d d_m + (1 - \alpha_d) g_m \; \forall m$
  $g_m = prox_{\iota_{C_{PN}}}(d_{relax,m} + h_m) \forall \; m$
  $h_m = h_m + d_{relax,m} - x_m \; \forall m$
  $r_x = \|x - y\|_2$
  $s_x = \rho \|y^{prev} - y\|_2$
  $r_d = \|d - g\|_2$
  $s_d = \sigma \|g^{prev} - g\|_2$
  $\epsilon_{x,pri} = \epsilon_{abs} \sqrt{KMN} + \epsilon_{rel} \max\{\|x\|_2, \|y\|_2\}$
  $\epsilon_{x,dua} = \epsilon_{abs} \sqrt{KMN} + \epsilon_{rel} \rho \|u\|_2$
  $\epsilon_{d,pri} = \epsilon_{abs} \sqrt{MN} + \epsilon_{rel} \max\{\|d\|_2, \|g\|_2\}$
  $\epsilon_{d,dua} = \epsilon_{abs} \sqrt{MN} + \epsilon_{rel} \sigma \|h\|_2$
  $y^{prev}_m = y_m \; \forall m$
  $g^{prev}_m = g_m \; \forall m$
  if $j \neq 1$ and $j \mod J_{x,p} = 0$ then
    if $r_x > \mu_x s_x$ then
      $\rho = \tau_x \rho$
      $u_m = u_m/\tau_x \; \forall m$
    else if $s_x > \mu_x r_x$ then
      $\rho = \rho/\tau_x$
      $u_m = \tau_x u_m \; \forall m$
    end
  end
  if $j \neq 1$ and $j \mod J_{d,p} = 0$ then
    if $r_d > \mu_d s_d$ then
      $\sigma = \tau_d \sigma$
      $h_m = h_m/\tau_d \; \forall m$
    else if $s_d > \mu_d r_d$ then
      $\sigma = \sigma/\tau_d$
      $h_m = \tau_d h_m \; \forall m$
    end
  end
until $j > J_{max}$ or ($r_x \leq \epsilon_{x,pri}$ and $sx \leq \epsilon_{x,dua}$ and $r_d \leq \epsilon_{d,pri}$ and $s_d \leq \epsilon_{d,dua}$)
Output: Dictionary $\{g_m\}$, coefficient maps $\{y_m\}$

---

Figure 7:
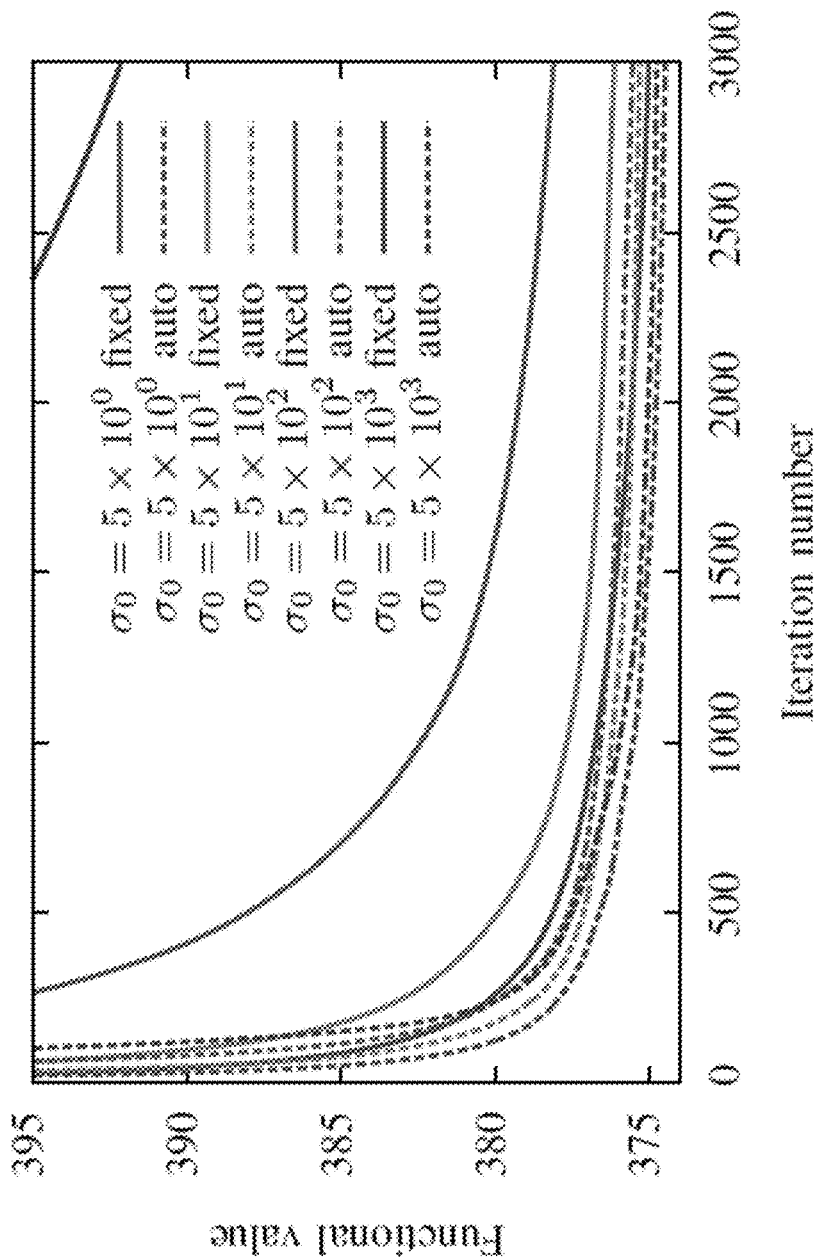
FIG. 7 is a graph illustrating dictionary learning functional value evolution for different choices of $\sigma_o$, with and without the automatic parameter adaptation scheme, according to an embodiment of the present invention.
Figure 8A:
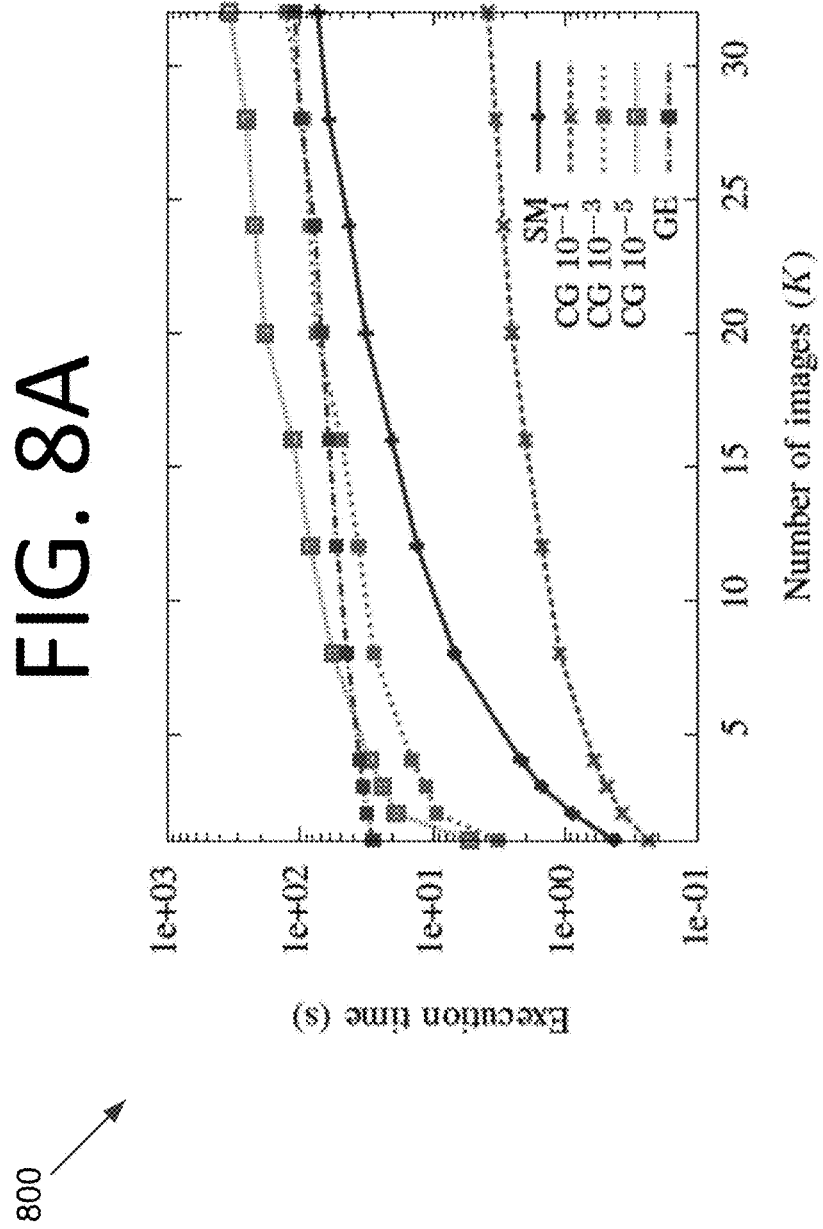
FIG. 8A is a graph illustrating execution times versus the number of images for a single precision solution of a linear system corresponding to an 8×8×64 dictionary with $\lambda=0.1$, according to an embodiment of the present invention.
Figure 8B:
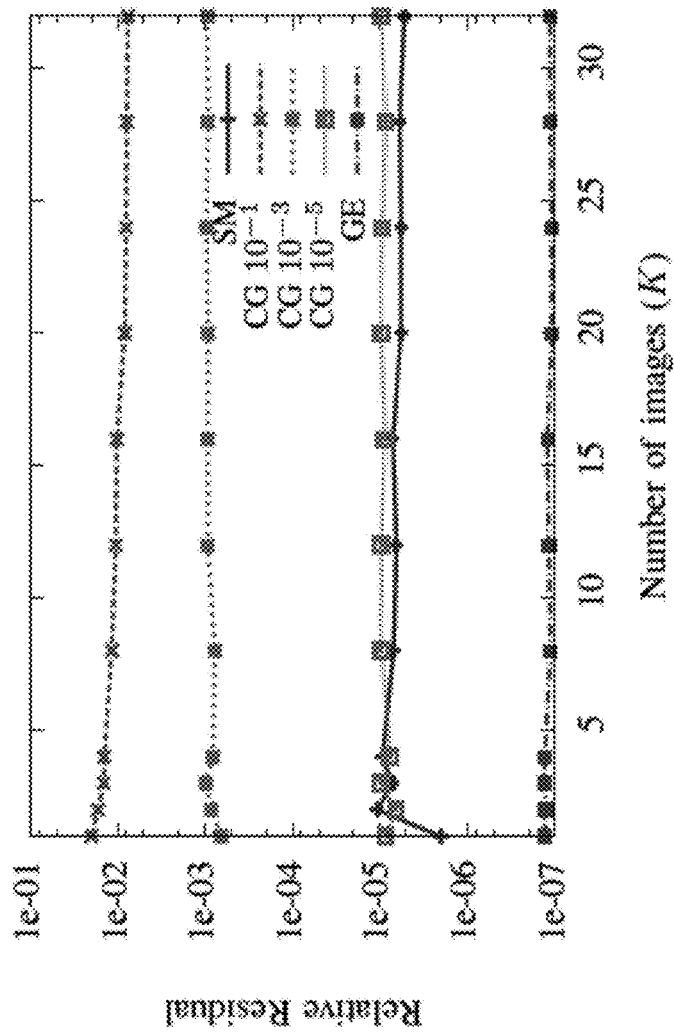
FIG. 8B is a graph illustrating solution error versus the number of images for a single precision solution of a linear system corresponding to an 8×8×64 dictionary with $\lambda=0.1$, according to an embodiment of the present invention.
Figure 9A:
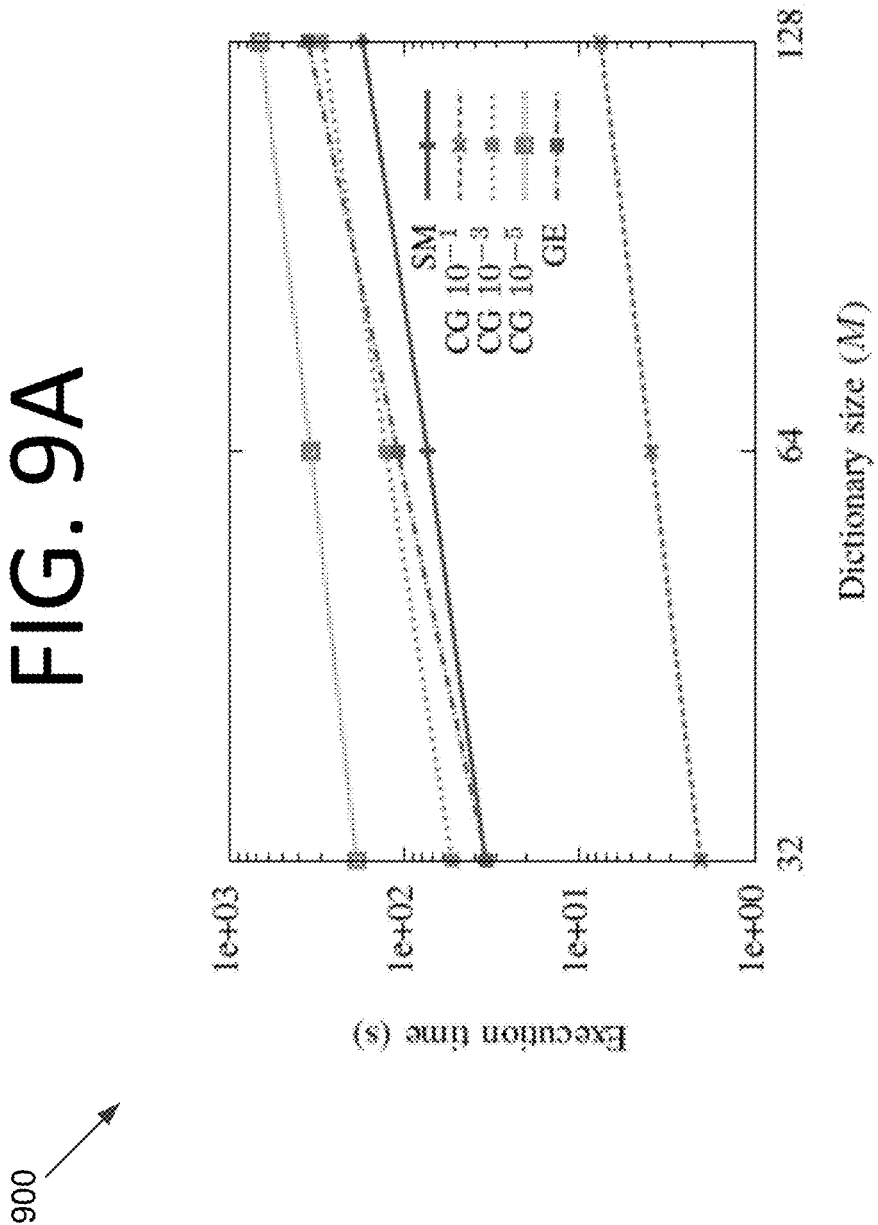
FIG. 9A is a graph illustrating execution times versus the dictionary size for a single precision solution of a linear system corresponding to an 8×8×M dictionary with K=32 and $\lambda=0.1$, according to an embodiment of the present invention.
Figure 9B:
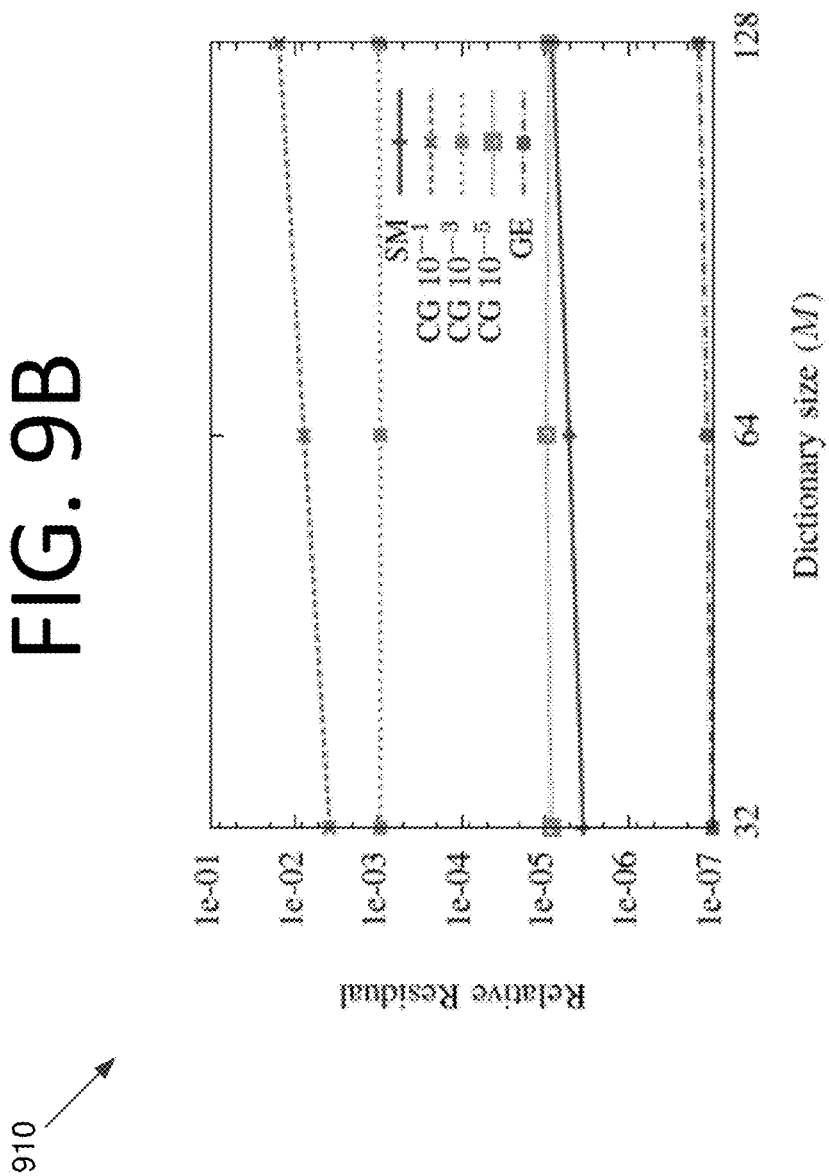
FIG. 9B is a graph illustrating solution error versus the dictionary size for a single precision solution of a linear system corresponding to an 8×8×M dictionary with K=32 and $\lambda=0.1$, according to an embodiment of the present invention.

The effects of different algorithm parameters are explored in graph 700 of FIG. 7. In FIG. 7, the dictionary was 8×8×64 with Gaussian random initialization and the training data was a set of five 256×256 images from the MIRFlickr dataset. In FIG. 7, $\lambda=0.1$ and $\rho_0=10.5$. Penalty auto-update parameters for the curves for which the automatic adaptation was active were $J_{x,p}=J_{d,p}=10$, $\mu_x=\mu_d=10$, and $\tau_x=\tau_d=2$, and relaxation parameters were $\alpha_x=\alpha_d=1.8$. $\sigma_0=5$ with automatic adaptation gives the best overall performance. Performance varies widely for different values of $\sigma_0$ when $\sigma$ is fixed, but the effect of $\sigma_0$ is small when automatic adaptation is enabled. It should be noted that the apparent relative differences between these curves are exaggerated by the scaling of the vertical axis. If the vertical axis were expanded to include the entire range of functional values, most of these differences would be observed to be relatively small, with no perceptible difference between any of the curves beyond 2000 iterations except for "$\sigma=5\times10^2$ fixed" and "$\sigma=5\times10^3$ fixed". It should also be noted that the effect of parameter $\sigma$ scales linearly with the number of training images K so that $\sigma_0 \approx K$ is a reasonable choice when applying the same parameters to a training set of a different size than the K=5 in this experiment.

Performance Comparison: Linear Solvers for ADMM

The execution times and solution accuracies of three different methods of solving the linear system are compared in graphs 800, 810, 900, 910 of FIGS. 8A, 8B, 9A, and 9B, respectively. Dictionaries D of different sizes M were constructed by initializing with Gaussian random dictionaries of the appropriate sizes, and the different training image sets S of size K were selected from a set of 256×256 training images derived from the MIRFlickr dataset. After an initial 20 iterations of the ADMM algorithm, the different methods were used to solve Eq. (50) for the following iteration, recording the time required by each. Reconstruction error was computed as the relative residual error with which solution $\hat{d}$ satisfies the linear equation of Eq. (50).

From these results, it can be seen that the CG $10^{-1}$ method is by far the fastest, but the solution accuracy is inadequate. The CG $10^{-5}$ method has similar solution accuracy to SM, but is substantially slower for small K values. In the sparse coding problem, the SM solution greatly outperforms the alternatives, but that is not always the case here, with other methods, including GE, becoming competitive for larger K values. This is not surprising since GE has a $\mathcal{O}(KM^3N)$ cost, while SM has a $\mathcal{O}(K^2MN)$ cost.

Figure 10:
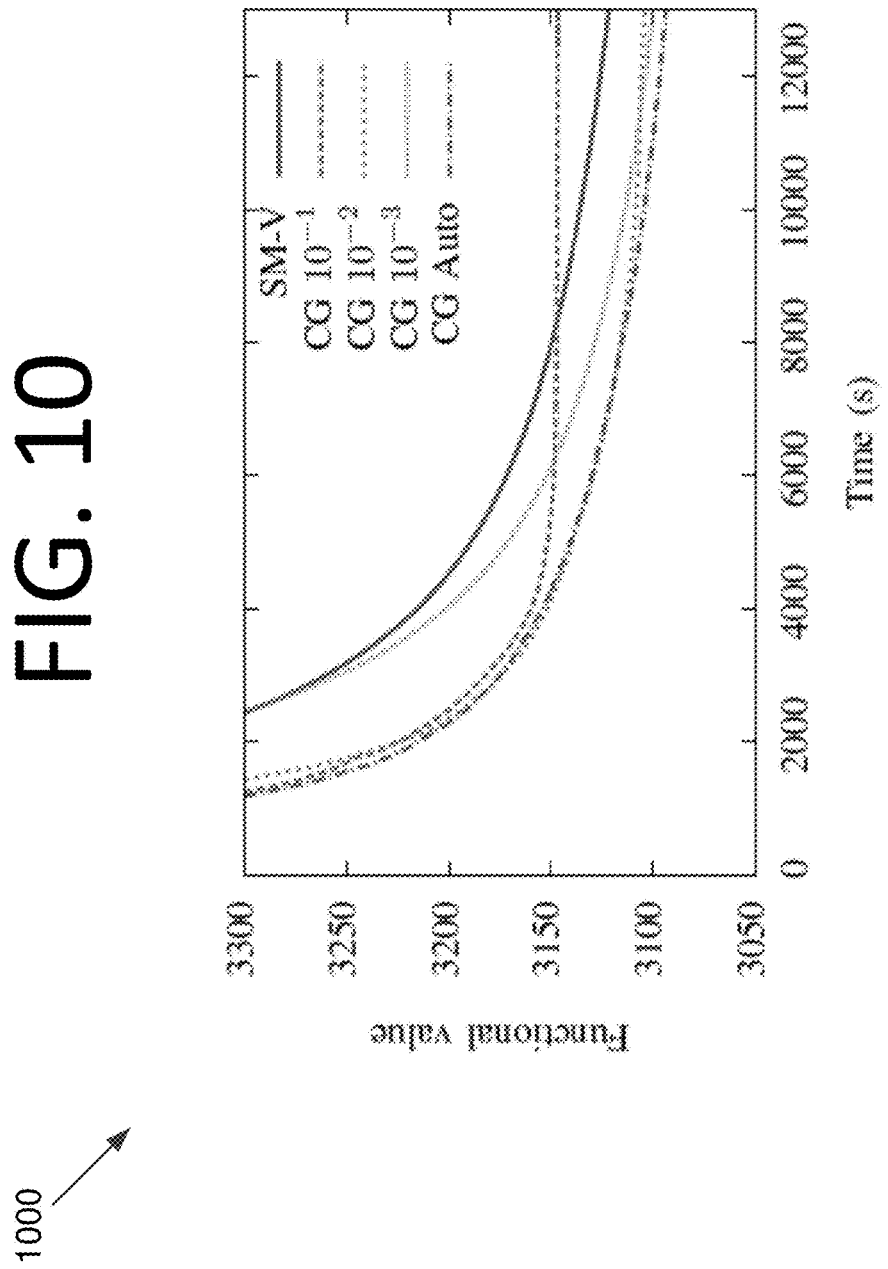
FIG. 10 is a graph illustrating a comparison of functional value evolution with time for the ADMM algorithm with Eq. (50) solved in single precision using Sherman-Morrison and CG with three different relative residual tolerances as well as an automatic tolerance selection method and an 8×8×64 dictionary with $\lambda=0.1$, according to an embodiment of the present invention.

The effects of the different tradeoffs between time and accuracy represented by the different solution methods can only be evaluated by comparing performance within a number of iterations of the full dictionary learning algorithm. Such a comparison was performed using the same dictionary size, value, and training data (with K=32) as for the experiments above, the results being presented in graph 1000 of FIG. 10. The double precision SM result is not shown since it would be indistinguishable from the single precision version on this graph. For this experiment, the maximum fractional difference between the two, occurring within the first few iterations, is $3.3 \times 10^{-5}$, and the median is $3.8 \times 10^{-6}$. Thus, double precision SM gives effectively the same solution, but at the cost of doubling the memory requirements and running approximately 30% slower than single precision. Since CG with a sufficiently large tolerance gives approximately the same solution accuracy independent of precision at an even greater computation time penalty, double precision CG is also not a useful option.

In addition to three different CG tolerances, these experiments also include an automatic CG tolerance method that starts with a tolerance of $10^{-1}$ at each iteration setting the CG tolerance to $\frac{1}{20}$ times the primal residual for the $d_m$ update if that quantity is smaller than the current tolerance. In this experiment, the auto-tolerance method is quite competitive, giving the overall best performance in terms of functional value reduction with time. In contrast, the best reduction with respect to the number of iterations is provided by SM and CG $10^{-3}$.

Multi-Scale Dictionaries

Prior methods all have structural constraints that are either imposed by the properties of the transform domain within which the sparse representation is computed or from the quadtree spatial structure imposed on the dictionary. This ultimately results from the difficulty of applying a multi-scale dictionary in a natural way within a patch-based framework.

Figure 11:
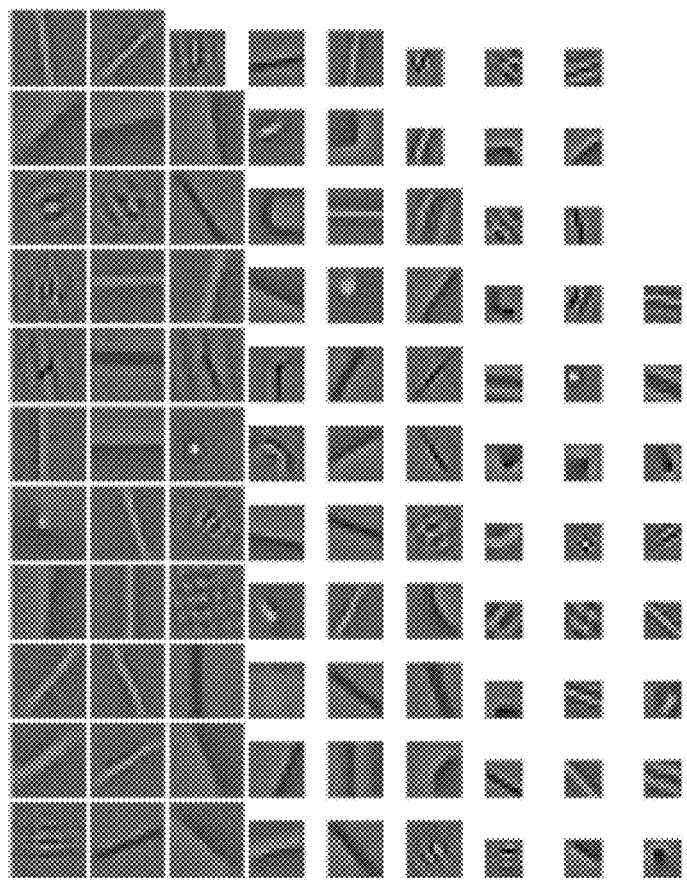
FIG. 11 illustrates a multi-scale dictionary with 8×8, 12×12, and 16×16 filters learned with $\lambda=0.1$ learned from a set of 32 512×512 training images, according to an embodiment of the present invention.

In the convolutional sparse representation framework, in contrast, there is no reason why the dictionary filters should be of the same size, and multi-scale dictionaries can be defined in a natural way, without any structural constraints on their form. An example of this shown in image 1100 of FIG. 11. Learning of such dictionaries is no more difficult than learning a single-scale dictionary, simply by replacing P with $P_m$ in Eq. (33), (35), (36), (44), and (45). Nonetheless, the learning and use of multi-scale convolutional dictionaries has not previously been considered in imaging applications, and has only received very limited attention in a signal processing context. For instance, the possibility of using filters of different lengths has been identified, but not discussed in any detail.

The potential advantage of a multi-scale dictionary is demonstrated by some simple experiments. A set of five different dictionaries, all with 72 filters, was learned using the same set of 16 images, and then used to solve the Convolutional BPDN problem using a separate set of 16 images as a test set. A corresponding experiment was also performed using a set of four dictionaries, all with 96 filters, trained on the same set of 32 images and tested on the same set of 23 images. The results in Table 1 show that a multi-scale dictionary can provide a lower cost representation than a single-scale dictionary with the same number of filters of the same size as one of the filter sizes in the multi-scale dictionary. More specifically, Table 1 shows a comparison of functional values for the Convolutional BPDN problem computed with $\lambda=0.01$ for the same set of images and with different dictionaries. The comparison in the upper rows was computed on the same set of 16 images and the comparison in the lower rows was computed with the same set of 23 images.

TABLE 1

| | SAME SET OF 16 IMAGES | | | | |
|---|---|---|---|---|---|
| Dict. | $8 \times 8 \times 72$ | $12 \times 12 \times 72$ | $8 \times 8 \times 24$, $12 \times 12 \times 48$ | $16 \times 16 \times 72$ | $8 \times 8 \times 24$, $16 \times 16 \times 48$ |
| Func. | $4.96 \times 10^2$ | $4.81 \times 10^2$ | $4.79 \times 10^2$ | $4.79 \times 10^2$ | $4.76 \times 10^2$ |
| | SAME SET OF 23 IMAGES | | | | |
| Dict. | $8 \times 8 \times 96$ | $12 \times 12 \times 96$ | $16 \times 16 \times 96$ | $8 \times 8 \times 16$, $12 \times 12 \times 32$, $16 \times 16 \times 48$ | N/A |
| Func. | $9.02 \times 10^2$ | $8.86 \times 10^2$ | $8.88 \times 10^2$ | $8.79 \times 10^2$ | N/A |

Figure 12:
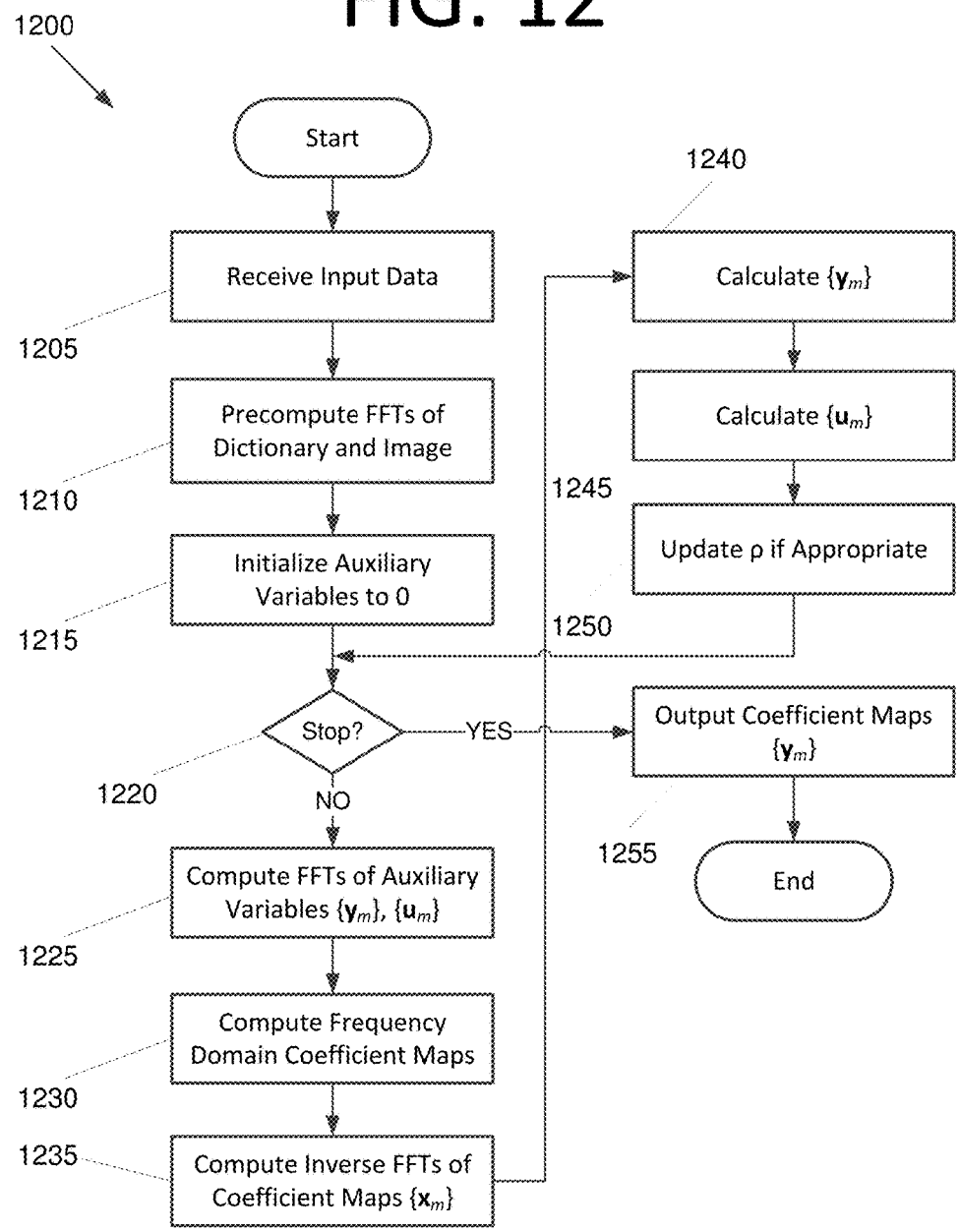
FIG. 12 is a flowchart illustrating a process for solving the convolutional sparse coding problem in the Fourier domain, according to an embodiment of the present invention.

FIG. 12 is a flowchart 1200 illustrating a process for solving the convolutional sparse coding problem in the Fourier domain, according to an embodiment of the present invention. In some embodiments, the process of FIG. 12 may be executed, for example, by computing system 1400 of FIG. 14. The process begins with receiving input data at 1205. The input data includes an image s, a filter dictionary $\{d_m\}$, and parameters $\lambda$ and $\rho$, as discussed above. The FFTs $\{\hat{D}_m\}$ of the dictionary $\{d_m\}$ and $\hat{s}$ of the image s are precomputed at 1210. Auxiliary variables are initialized to 0 at 1215, such that $\{y_m\}=\{u_m\}=0$.

After initialization and precomputing of the FFTs, it is determined whether stopping criteria are met at 1220. These stopping criteria are described in more detail in S. Boyd, N. Parikh, E. Chu, B. Peleato, and J. Eckstein, "Distributed Optimization and Statistical Learning via the Alternating Direction Method of Multipliers," Foundations and Trends in Machine Learning, vol. 3, no. 1, pp. 1-122 (2010). If the stopping criteria are met at 1220, the coefficient maps $\{y_m\}$ are output at 1255 and the process ends.

However, if the stopping criteria are not met at 1220, the FFTs $\{\hat{y}_m\}$ of auxiliary variables $\{y_m\}$ and $\{\hat{u}_m\}$ of dual variables $\{u_m\}$ are computed at 1825. The coefficient maps are computed in the frequency domain at 1230 using Eq. (21-29). The inverse FFTs $\{x_m\}$ of the frequency domain coefficient maps $\{\hat{x}_m\}$ are then computed at 1235.

$\{y_m\}$ is calculated at 1240 using Eq. (14) and $\{u_m\}$ is calculated at 1245 using Eq. (13). $\rho$ is updated at 1250 if appropriate depending on the selected standard update strategy. The process then returns to 1220 and repeats in this manner until the stopping criteria are met.

Figure 13:
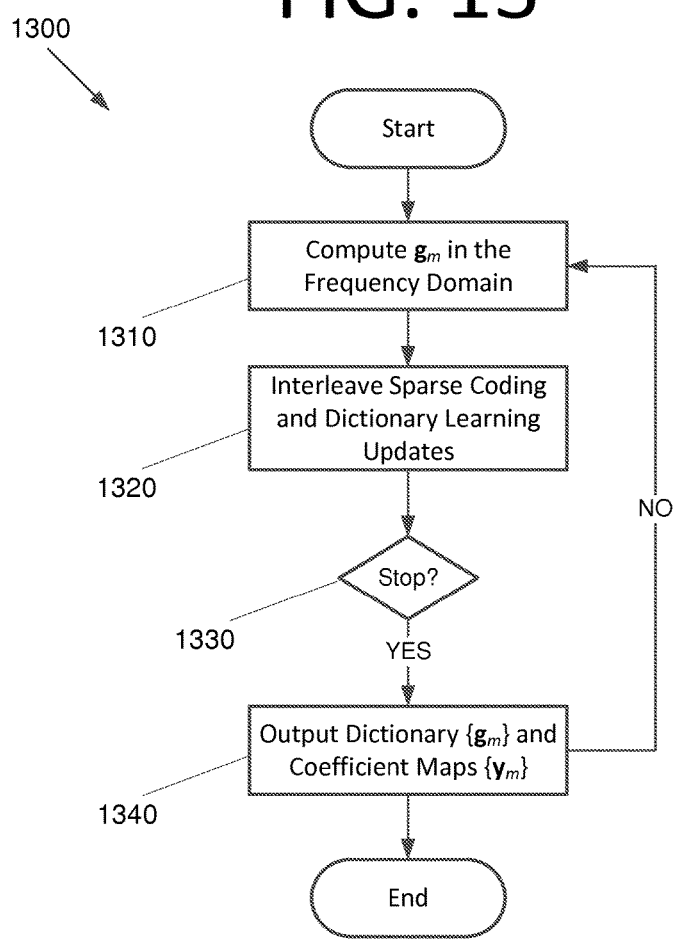
FIG. 13 is a flowchart illustrating a process for fast dictionary learning, according to an embodiment of the present invention.

FIG. 13 is a flowchart 1300 illustrating a process for fast dictionary learning, according to an embodiment of the present invention. Per the above, since the constrained problem in this case requires an iterative solution, the normalization $\|d_m\|_2=1$ or $\|d_m\|_2 \leq 1$ of the dictionary elements is included, rather than performing the normalization as a postprocessing step after the dictionary update.

A novel aspect of the dictionary learning of some embodiments is in using the iterated Sherman-Morrison algorithm for the dictionary update. For a relatively small number of training images K, this is considerably faster than previous methods for solving this update. For instance, if K=1, this approach may be 10 times faster than other methods, but this also depends on other factors, such as the size of the dictionary. As K becomes larger, the performance improvement decreases, and is eventually overtaken by standard methods of solving a linear system, such as Conjugate Gradient and Gaussian Elimination. More specifically, as K increases, the advantage is slowly reduced, with very limited advantage remaining by K=32. If the dictionary is smaller (i.e., M is smaller), this point will be reached at a smaller K, and conversely, if M is larger, at a larger K.

Another novel aspect of some embodiments is in the interleaving between sparse coding and dictionary updates in the dictionary learning algorithm above. Bristow et al. used $d_m$ as the dictionary in the sparse coding stage and $x_{k,m}$ as the sparse representation in the dictionary update stage. Such a combination turns out to be quite unstable in practice. However, the algorithm is much more stable if g and y, respectively, are used for these two stages.

The process begins with computing $\hat{g}_m$ $\forall m$ as in Eq. (46)-(50) using $\hat{y}_{k,m}$ as the coefficient maps and using the iterated Sherman-Morrison algorithm for the dictionary update at 1310. Updates on sparse coding and dictionary learning are interleaved at 1320 such that $g_m$ represent the dictionary in the sparse coding steps, and $y_{k,m}$ represent the sparse code in the dictionary update steps. If stopping tolerances are met at 1330, the process proceeds to outputting the dictionary $\{g_m\}$ and coefficient maps $\{y_m\}$ at 1340. Otherwise, the process returns to 1310.

Figure 14:
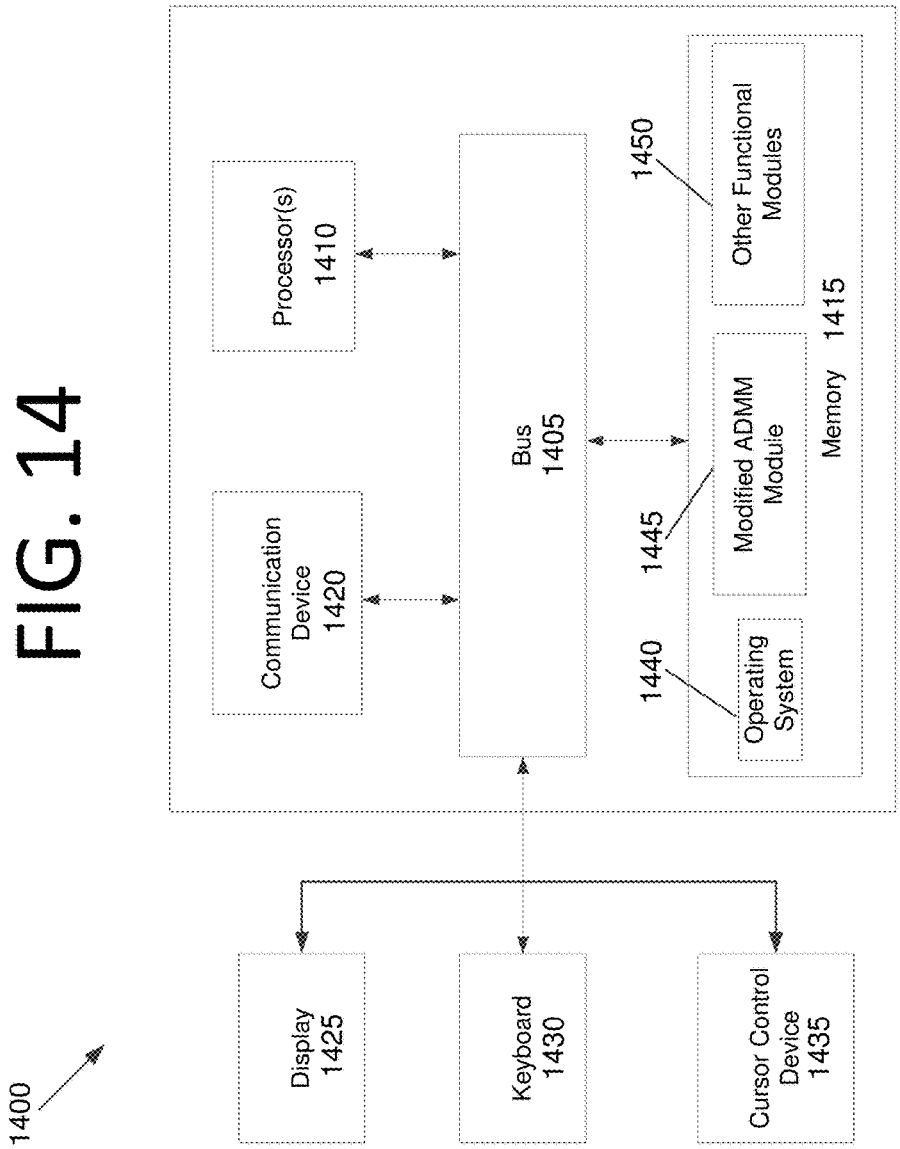
FIG. 14 is a block diagram of a computing system configured to perform fast dictionary learning and solve the convolutional sparse coding problem in the Fourier domain, according to an embodiment of the present invention.

FIG. 14 is a block diagram of a computing system 1400 configured to perform fast dictionary learning and solve the convolutional sparse coding problem in the Fourier domain, according to an embodiment of the present invention. Computing system 1400 includes a bus 1405 or other communication mechanism for communicating information, and processor(s) 1410 coupled to bus 1405 for processing information. Processor(s) 1410 may be any type of general or specific purpose processor, including a central processing unit ("CPU") or application specific integrated circuit ("ASIC"). Processor(s) 1410 may also have multiple processing cores, and at least some of the cores may be configured to perform specific functions. Multi-parallel processing may be used in some embodiments. Computing system 1400 further includes a memory 1415 for storing information and instructions to be executed by processor(s) 1410. Memory 1415 can be comprised of any combination of random access memory (RAM), read only memory (ROM), flash memory, cache, static storage such as a magnetic or optical disk, or any other types of non-transitory computer-readable media or combinations thereof. Additionally, computing system 1400 includes a communication device 1420, such as a transceiver and antenna, to wirelessly provide access to a communications network.

Non-transitory computer-readable media may be any available media that can be accessed by processor(s) 1410 and may include both volatile and non-volatile media, removable and non-removable media, and communication media. Communication media may include computer-readable instructions, data structures, program modules or other data in a modulated data signal such as a carrier wave or other transport mechanism and includes any information delivery media.

Processor(s) 1410 are further coupled via bus 1405 to a display 1425, such as a Liquid Crystal Display (LCD), for displaying information to a user. A keyboard 1430 and a cursor control device 1435, such as a computer mouse, are further coupled to bus 1405 to enable a user to interface with computing system. However, in certain embodiments such as those for mobile computing implementations, a physical keyboard and mouse may not be present, and the user may interact with the device solely through display 1425 and/or a touchpad (not shown). Any type and combination of input devices may be used as a matter of design choice.

Memory 1415 stores software modules that provide functionality when executed by processor(s) 1410. The modules include an operating system 1440 for computing system 1400. The modules further include a modified ADMM module 1445 that is configured to perform fast dictionary learning and solve the convolutional sparse coding problem in the Fourier domain. Computing system 1400 may include one or more additional functional modules 1450 that include additional functionality.

One skilled in the art will appreciate that a "system" could be embodied as an embedded computing system, a personal computer, a server, a console, a personal digital assistant (PDA), a cell phone, a tablet computing device, or any other suitable computing device, or combination of devices. Presenting the above-described functions as being performed by a "system" is not intended to limit the scope of the present invention in any way, but is intended to provide one example of many embodiments of the present invention. Indeed, methods, systems and apparatuses disclosed herein may be implemented in localized and distributed forms consistent with computing technology, including cloud computing systems.

It should be noted that some of the system features described in this specification have been presented as modules, in order to more particularly emphasize their implementation independence. For example, a module may be implemented as a hardware circuit comprising custom very large scale integration ("VLSI") circuits or gate arrays, off-the-shelf semiconductors such as logic chips, transistors, or other discrete components. A module may also be implemented in programmable hardware devices such as field programmable gate arrays, programmable array logic, programmable logic devices, graphics processing units, or the like.

A module may also be at least partially implemented in software for execution by various types of processors. An identified unit of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations which, when joined logically together, comprise the module and achieve the stated purpose for the module. Further, modules may be stored on a computer-readable medium, which may be, for instance, a hard disk drive, flash device, RAM, tape, or any other such medium used to store data.

Indeed, a module of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network.

The process steps performed in FIGS. 12 and 13 may be performed by a computer program, encoding instructions for the nonlinear adaptive processor to perform at least the processes described in FIGS. 12 and 13, in accordance with embodiments of the present invention. The computer program may be embodied on a non-transitory computer-readable medium. The computer-readable medium may be, but is not limited to, a hard disk drive, a flash device, a random access memory, a tape, or any other such medium used to store data. The computer program may include encoded instructions for controlling the nonlinear adaptive processor to implement the processes described in FIGS. 12 and 13, which may also be stored on the computer-readable medium.

The computer program can be implemented in hardware, software, or a hybrid implementation. The computer program can be composed of modules that are in operative communication with one another, and which are designed to pass information or instructions to display. The computer program can be configured to operate on a general purpose computer, or an ASIC.

Some embodiments pertain to computationally efficient algorithms for fast dictionary learning and solving the convolutional sparse coding problem in the Fourier domain. Such algorithms may enable a significant reduction in computational cost over conventional approaches by implementing a linear solver for the most critical and computationally expensive component of the conventional iterative algorithm. At a high level, the derivation of ADMM algorithms for convolutional sparse coding and the dictionary update for dictionary learning is relatively straightforward, but correct choice of methods for solving the linear sub-problems is critical to the design of efficient algorithms, with vastly inferior computational performance resulting if these methods are not properly chosen. The results presented herein show that the proposed Sherman-Morrison solution of the main linear system is clearly the best choice for the Convolutional BPDN sparse coding problem, giving much better asymptotic performance of $\mathcal{O}(M)$ instead of $\mathcal{O}(M^3)$, as obtained by a previous direct method. Also, The Sherman-Morrison solution is much faster in practical application. Furthermore, over-relaxation methods are shown to improve performance, and effective heuristic techniques for selection of the penalty parameter are presented. The resulting ADMM algorithm has been shown to be much faster than a previously proposed Fast Iterative Shrinkage-Thresholding Algorithm (FISTA) approach, and faster to varying degrees depending on the regularization parameter when the gradient required by FISTA is computed in the DFT domain.

In the case of Convolutional BPDN dictionary learning, an iterated Sherman-Morrison solution of the main linear system in the dictionary update stage is the best choice for a small number of training images K, but other methods become competitive for larger K. Overall, a CG solution with a moderate accuracy tolerance or with an adaptive tolerance appears to be the best choice when K is large. It is also demonstrated that the proposed dictionary learning algorithm can be used to construct convolutional multi-scale dictionaries that do not have any of the structural constraints or complications inherent in previous approaches to constructing multi-scale dictionaries within the standard patch-based framework.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A computer-implemented method, comprising:
deriving efficient convolutional sparse coding in a frequency domain, by a computing system, within an alternating direction method of multipliers (ADMM) framework using fast Fourier transforms (FFTs);
determining, by the computing system, coefficient maps of a signal or image vector s using the derived efficient convolutional sparse coding; and
when stopping criteria are met, outputting the coefficient maps, by the computing system, as a sparse representation of s.

2. The computer-implemented method of claim 1, wherein the coefficient maps are determined with an efficiency of O(MN log N), where N is a dimensionality of the data and M is a number of elements in a dictionary.

3. The computer-implemented method of claim 1, wherein the coefficient maps are computed using only inner products, element-wise addition, and scalar multiplication as vector operations.

4. The computer-implemented method of claim 1, further comprising:
   precomputing, by the computing system, FFTs of a dictionary D and the signal or image vector s.

5. The computer-implemented method of claim 1, further comprising:
   initializing auxiliary variables, by the computing system, to zero.

6. The computer-implemented method of claim 1, wherein while the stopping criteria have not been met, the method further comprises:
   computing, by the computing system, FFTs of auxiliary variables, frequency domain coefficient maps, inverse FFTs of the coefficient maps, and calculating the auxiliary variables; and
   updating auxiliary parameter ρ when convergence to a desired accuracy has not occurred.

7. The computer-implemented method of claim 1, wherein the computing system determines a set of coefficient maps in the frequency domain by $$v_n = \rho^{-1}\left(b_n - \frac{a_n^H b_n}{\rho + a_n^H a_n} a_n\right).$$

8. The computer-implemented method of claim 1, further comprising:
   learning a dictionary D from a set of training data, wherein a FFT of D yields a dictionary in the frequency domain $\hat{D}$ such that $$\hat{D} = \begin{pmatrix} \hat{d}_{0,0} & 0 & 0 & \cdots & \hat{d}_{1,0} & 0 & 0 & \cdots \\ 0 & \hat{d}_{0,1} & 0 & \cdots & 0 & \hat{d}_{1,1} & 0 & \cdots \\ 0 & 0 & \hat{d}_{0,2} & \cdots & 0 & 0 & \hat{d}_{1,2} & \cdots \\ \vdots & \vdots & \vdots & \ddots & \vdots & \vdots & \vdots & \ddots \end{pmatrix}$$

where $\hat{D}$ is concatenated as a set of block matrices and each block matrix is a diagonal.

9. The computer-implemented method of claim 8, wherein D is a multi-scale dictionary.

10. The computer-implemented method of claim 1, further comprising:
   computing, by the computing system, a dictionary in a frequency domain $\hat{g}_m$ $\forall m$ using $\hat{y}_{k,m}$ as coefficient maps and using an iterated Sherman-Morrison algorithm for a dictionary update; and
   outputting, by the computing system, a dictionary $\{g_m\}$ when stopping tolerances are met.

11. The computer-implemented method of claim 10, further comprising:
   interleaving, by the computing system, updates on sparse coding and dictionary learning such that $g_m$ represents the dictionary in sparse coding steps and $y_{k,m}$ represent sparse coding in dictionary steps; and
   outputting, by the computing system, coefficient maps $\{y_m\}$ when the stopping tolerances are met.

* * * * *